(12) United States Patent
Hachino

(10) Patent No.: US 7,821,819 B2
(45) Date of Patent: Oct. 26, 2010

(54) SEMICONDUCTOR MEMORY DEVICE AND ITS DATA READING METHOD

(75) Inventor: Hidenari Hachino, Nagasaki (JP)

(73) Assignee: Sony Corporation, Tokyo (JP)

( * ) Notice: Subject to any disclaimer, the term of this patent is extended or adjusted under 35 U.S.C. 154(b) by 163 days.

(21) Appl. No.: 12/149,558

(22) Filed: May 5, 2008

(65) Prior Publication Data

US 2008/0310218 A1    Dec. 18, 2008

(30) Foreign Application Priority Data

Jun. 13, 2007    (JP)    ............................. 2007-156340

(51) Int. Cl.
*G11C 11/00* (2006.01)

(52) U.S. Cl. ..................................................... 365/158

(58) Field of Classification Search ................... 365/158
See application file for complete search history.

(56) References Cited

U.S. PATENT DOCUMENTS

2004/0141368 A1 *   7/2004   Inaba .......................... 365/158
2004/0264064 A1 * 12/2004   Sakakima .................... 360/322

FOREIGN PATENT DOCUMENTS

JP        2006-196613 A      7/2006
JP        2006-210711 A      8/2006

* cited by examiner

*Primary Examiner*—Hoai V Ho
*Assistant Examiner*—Anthan T. Tran
(74) *Attorney, Agent, or Firm*—Rader, Fishman & Grauer PLLC

(57) ABSTRACT

Disclosed herein is a semiconductor memory device including a plurality of magnetic memory elements, a control line group and a read driving circuit.

6 Claims, 17 Drawing Sheets

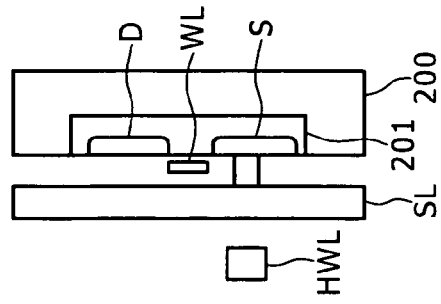
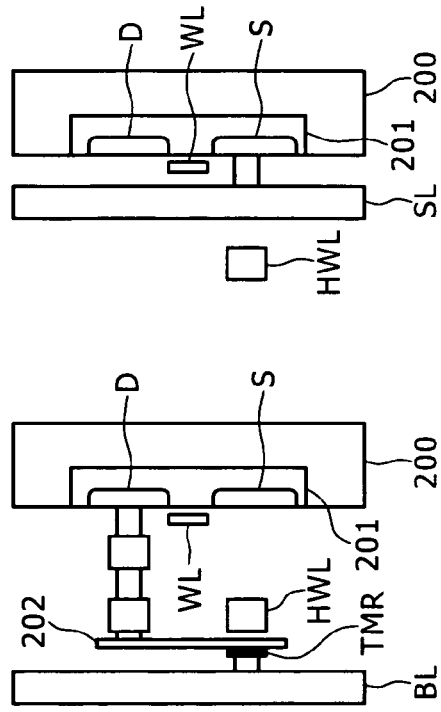
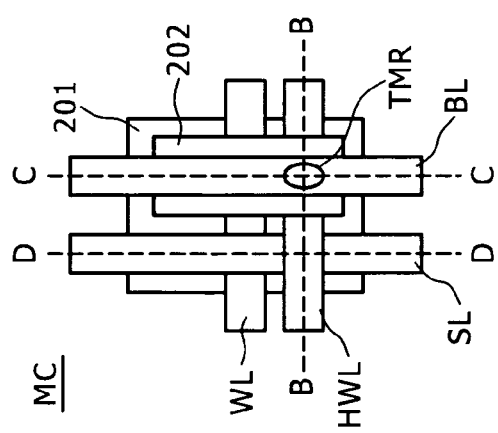
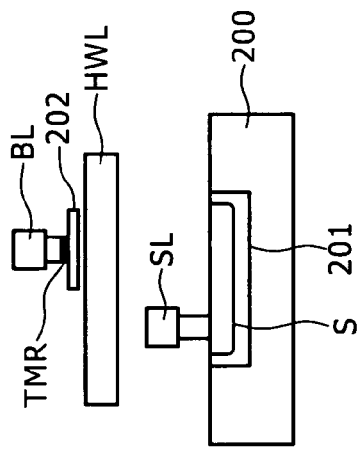

DATA OF 0
(LOW RESISTANCE IN ALL L
RESISTANCE STATE)

DATA OF 1
(LOW RESISTANCE IN ALL H
RESISTANCE STATE)

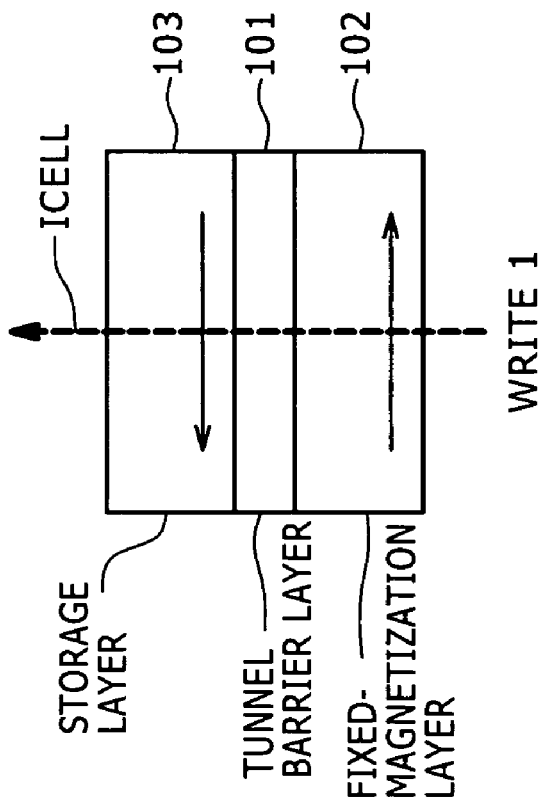
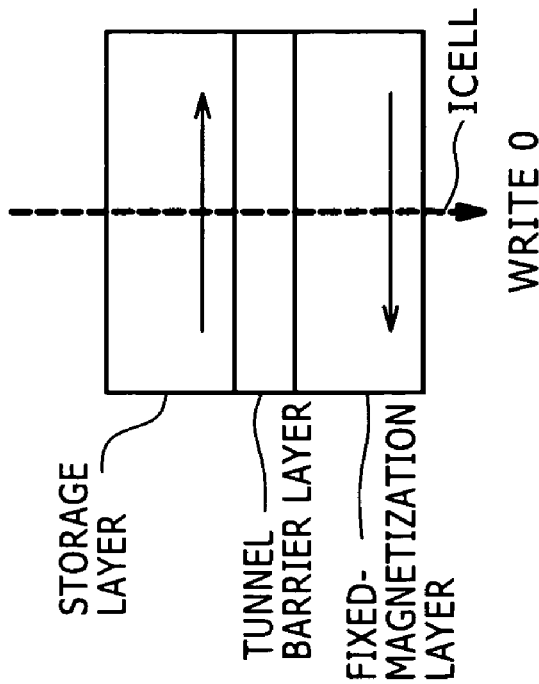

SELECTED CELL

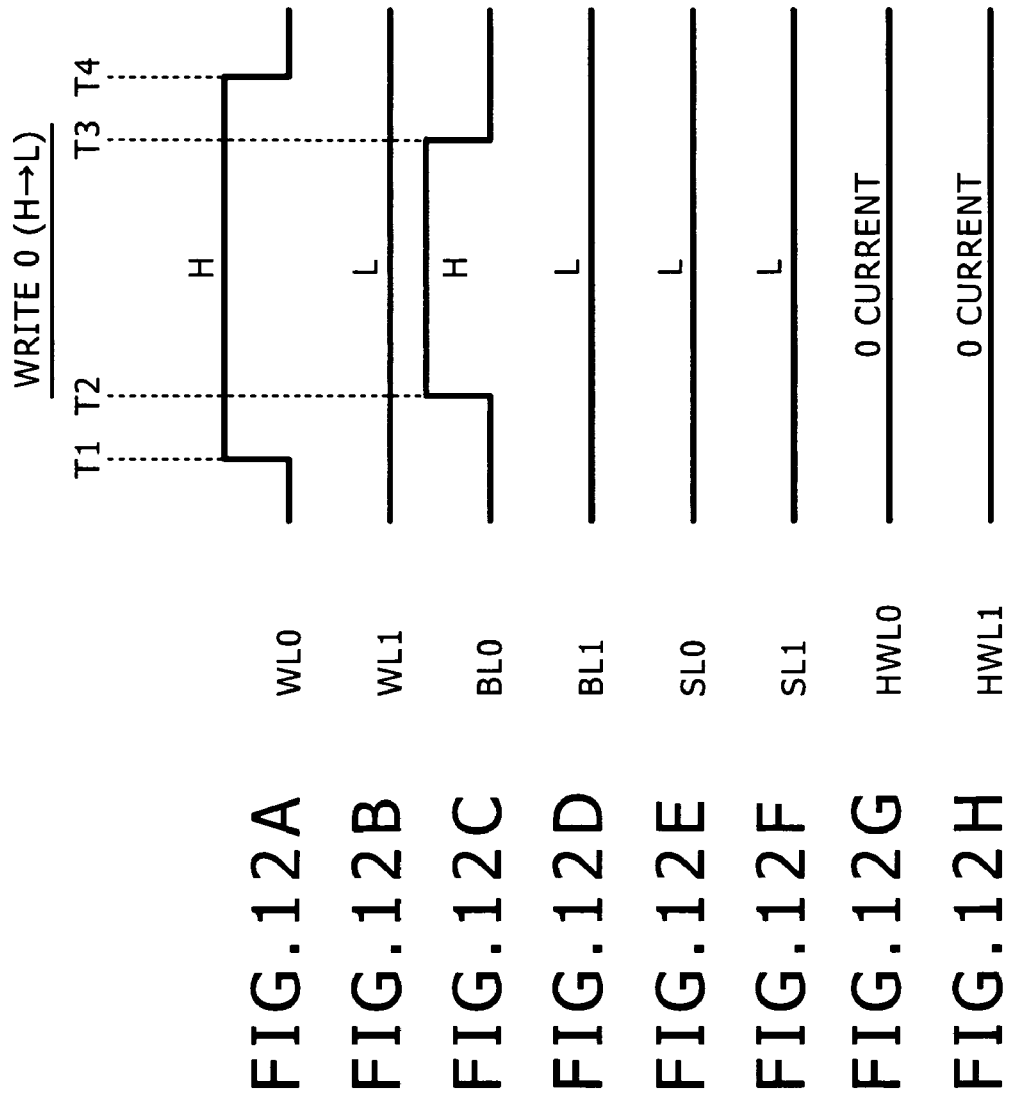

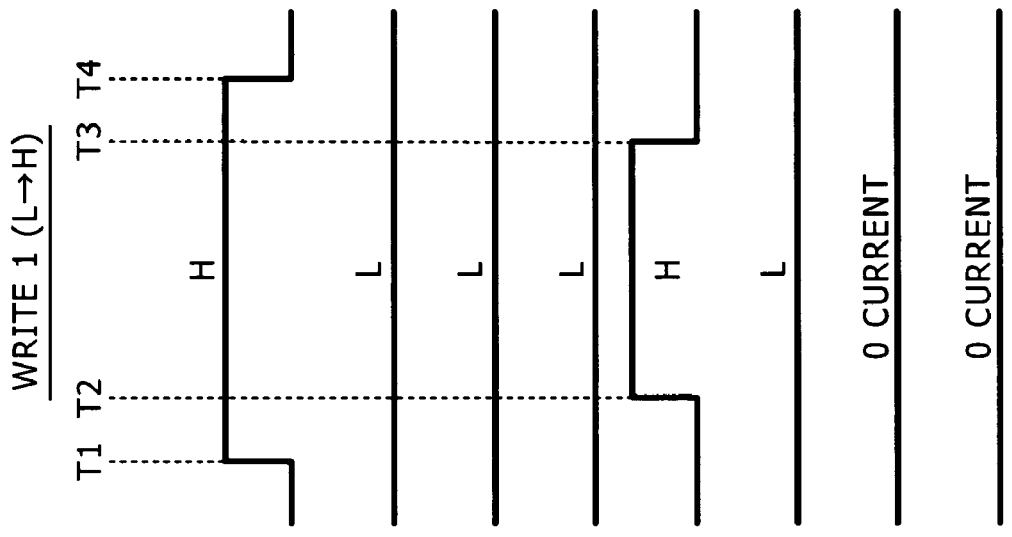

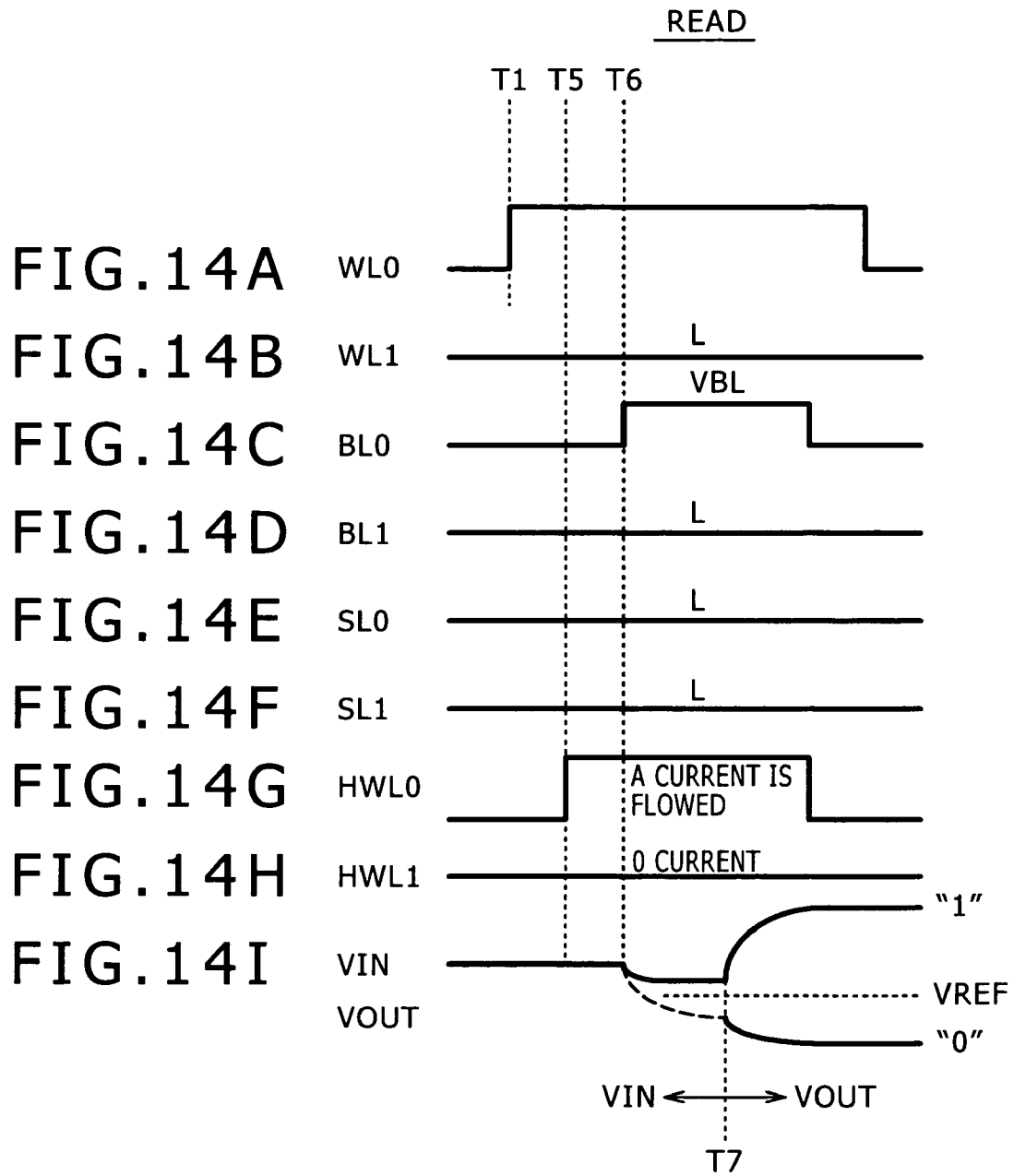

FIG.15A  FIG.15B
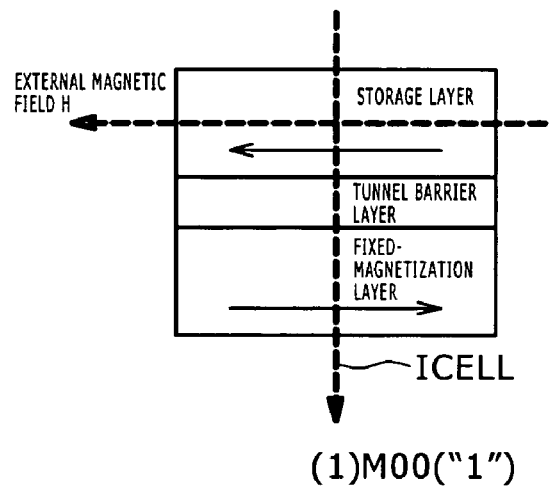 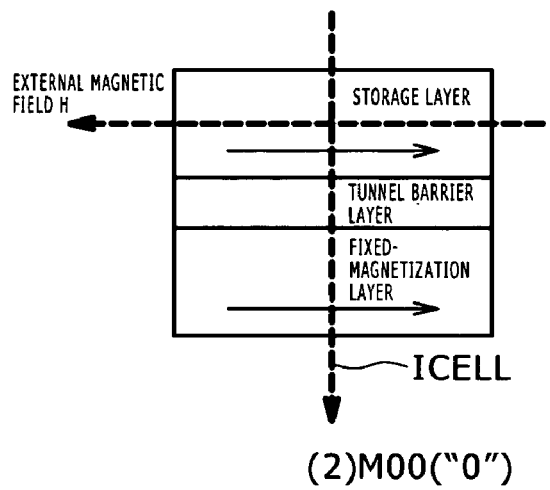
(1)M00("1")   (2)M00("0")
FIG.15C  FIG.15D
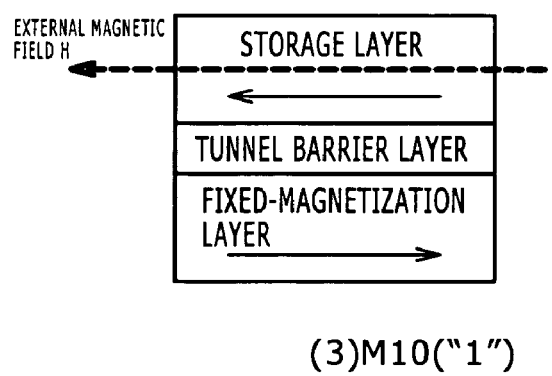 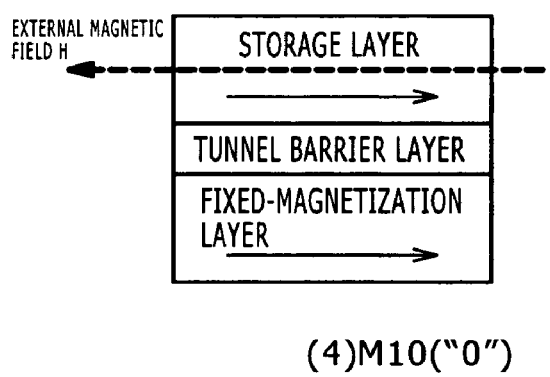
(3)M10("1")   (4)M10("0")

US 7,821,819 B2

SEMICONDUCTOR MEMORY DEVICE AND ITS DATA READING METHOD

CROSS REFERENCES TO RELATED APPLICATIONS

The present invention contains subject matter related to Japanese Patent Application JP 2007-156340 filed with the Japan Patent Office on Jun. 13, 2007, the entire contents of which being incorporated herein by reference.

BACKGROUND OF THE INVENTION

1. Field of the Invention

The present invention relates to a semiconductor memory device which employs a plurality of memory cells each including a magnetic memory element having a storage layer for holding bit data as a direction of the magnetization state of the storage layer and allows new bit data to be written over bit data already stored in the storage layer of a magnetic memory element by flowing a current to the storage layer in order to invert the direction of magnetization. In addition, the present invention also relates to a method for reading out bit data from the semiconductor memory device.

2. Description of the Related Art

In recent years, as a new nonvolatile memory making use of a magnetic material, an MRAM (magnetic random access memory) has been attracting attention.

The MRAM employs a large number of memory cells each including a magnetic memory element used for storing information (that is, bit data) and an access transistor. The magnetic memory element has a structure of stacked layers including a storage layer made of a ferromagnetic material and used for storing bit data as a direction of the magnetization state of the ferromagnetic material, a tunnel insulation layer and a fixed-magnetization layer having a fixed direction of magnetization.

In the magnetic memory element having such a structure of stacked layers, the so-called tunnel magnetization resistance effect is observed to give an observation result determined by an angle formed by the direction of the magnetization state of the storage layer and the direction of the magnetization state of the fixed-magnetization layer. The tunnel magnetization resistance effect is a phenomenon in which a resistance against a tunnel current flowing through the magnetic memory element changes in accordance with the angle formed by the direction of the magnetization state of the storage layer and the direction of the magnetization state of the fixed-magnetization layer. That is to say, the resistance against a tunnel current is the result of the observation. The resistance has a minimum value if the direction of the magnetization state of the storage layer is the same as the direction of the magnetization state of the fixed-magnetization layer, forming an angle of 0 degrees. If the direction of the magnetization state of the storage layer is opposite to the direction of the magnetization state of the fixed-magnetization layer, forming an angle of 180 degrees, on the other hand, the resistance has a maximum value.

In the following description, the magnetic memory element displaying such a property is referred to as a TMR (tunnel magnetic resistance) element.

The tunnel magnetic resistance element TMR is connected to the word and bit lines typically as shown in FIG. 1, which is a diagram showing the configuration of a memory cell having a parallel common line type. The configuration of a memory cell having a parallel common line type can be explained by referring to the figure as follows. The word line WL is a line conveying a signal for turning the access transistor AT on or off in order to respectively select or deselect the memory cell employing the transistor AT. The word line WL is a control line common to memory cells arranged in the row direction. On the other hand, the bit line BL serving as a control line common to memory cells arranged in the column direction connects a particular one of the terminals of the tunnel magnetic resistance element TMR employed in each of the memory cells which each also include an access transistor AT as described above. Each of the particular terminals connected by the bit line BL to each other is a terminal on a particular side of the tunnel magnetic resistance element TMR included in the memory cell. The particular side of the tunnel magnetic resistance element TMR is the side opposite to the side on which the access transistor AT is provided. That is to say, the other terminal of the tunnel magnetic resistance element TMR is connected to drain of the access transistor AT. The source of the access transistor AT is connected directly to a source line SL. The bit line BL and the source line SL serve as lines applying voltages to the memory cell as voltages for storing bit data into a memory cell connected to the bit line BL and the source line SL or reading out bit data from the memory cell. An operation to write bit data into a tunnel magnetic resistance element TMR is carried out by controlling the magnetization state of the storage layer of the tunnel magnetic resistance element TMR by asserting the voltages on the bit line BL and the source line SL. In addition to the voltages asserted on the bit line BL and the source line SL, the magnetization state of the storage layer of the tunnel magnetic resistance element TMR is also controlled by making use of a compound current magnetic field generated by flowing currents through both the word line WL and a bit line BL perpendicular to the word line WL.

Bit data of 1 or 0 is stored in a memory cell as respectively two directions of the magnetization of the storage layer included in the tunnel magnetic resistance element TMR employed in the memory cell. For example, the bit data having the value of 0 is stored in the memory cell as the same direction of magnetization as the direction of the magnetization state of the fixed-magnetization layer included in the tunnel magnetic resistance element TMR. On the other hand, the bit data having the value of 1 is stored in the memory cell as the magnetization-state direction opposite to the direction of the magnetization state of the fixed-magnetization layer.

In an operation to read out bit data from a tunnel magnetic resistance element TMR employed in a memory cell of an MRAM, on the other hand, first of all, the memory cell is selected by activating the access transistor AT employed in the same memory cell as the tunnel magnetic resistance element TMR. As described above, the access transistor AT is activated by putting the word line WL in an active state. Then, a read voltage determined in advance is asserted on the bit line BL connected to the tunnel magnetic resistance element TMR in order to flow a read tunnel current through the tunnel magnetic resistance element TMR, and a tunnel magnetic resistance effect of the tunnel magnetic resistance element TMR is detected as an effect resulting from the flowing of the current. In a word, the magnitude of the resistance of the tunnel magnetic resistance element TMR is detected. As described above, the magnitude of the resistance indicates an angle formed by the direction of the magnetization state of the storage layer and the direction of the magnetization state of the fixed-magnetization layer. That is to say, the magnitude of the resistance represents the value of bit data stored in the memory cell. By turning on the access transistor AT as described above, the read tunnel current flows to the tunnel magnetic resistance element TMR and the resistance against the current is determined by the value of the bit data stored in the memory cell. That is to say, by detecting the read tunnel current which is determined by the resistance, it is possible to determine whether the stored bit data has a value of 1 or 0.

However, the MRAM device demands that large currents be flowed to two wires having directions perpendicular to each other as described above in order to generate a write magnetic field (or the compound magnetic field cited before) in a write operation. The two wires are an external-magnetic-field generation line HWL parallel to the word line WL and the bit line BL perpendicular to the word line WL as shown in FIG. 1. Thus, the MRAM device has a shortcoming that, as the MRAM device is miniaturized, the wires also becomes thin, making it difficult to flow sufficient currents through the wires.

In order to solve this problem, a spin injection memory has been introduced and has been attracting attention. The spin injection memory is a memory utilizing a spin transfer for inverting magnetization so that magnetization can be inverted by making use of smaller currents. For more information on the spin injection memory, the reader is suggested to refer to document such as Japanese Patent Laid-open No. 2006-196613.

To put it in detail, in the spin injection memory, by injection of electrons each experiencing spin polarization in passing through a specific magnetic substance into another magnetic substance provided as an information storage ferromagnetic layer, the magnetization of the other magnetic substance is inverted.

To put it more concretely, when electrons each experiencing spin polarization in passing through the magnetic substance serving as a fixed-magnetization layer having a fixed-magnetization direction enter the ferromagnetic layer serving as the information storage layer having a reversible direction of magnetization in a write operation, each of the electrons applies a spin torque to the information storage layer. At that time, if a current having a magnitude at least equal to a threshold value is flowed, a magnetization inversion phenomenon occurs in the ferromagnetic layer serving as the information storage layer, causing new bit data to be written over bit data already stored in the information storage layer.

It is to be noted that the direction of the current to be flowed is determined by whether the bit data to be stored is 1 or 0. That is to say, a current is flowed from the fixed-magnetization layer to the storage layer in an operation to store bit data having one of the two values whereas a current is flowed from the storage layer to the fixed-magnetization layer in an operation to store bit data having the other value.

Much like the existing MRAM, an operation to read out bit data from the spin injection memory is carried out by detecting the tunnel magnetic resistance effect. That is to say, by detecting a read tunnel current, the magnitude of which is determined by a resistance against the current, it is possible to determine whether the stored bit data has the value of 1 or 0 since the resistance represents the value of the bit data.

The spin injection memory offers a merit that inversion of magnetization by a spin transfer occurs without the need to increase the magnitude of the flowing write current in a write operation. That is to say, inversion of magnetization by a spin transfer occurs even if the spin injection memory is miniaturized because the magnetization inversion by a spin transfer can be carried out at a small flowing current entailed by miniaturization of the memory. In addition, the spin injection memory offers a merit that the spin injection memory does not demand an external-magnetic-field generation line (the line HWL shown in FIG. 1) which is needed by the existing MRAM.

Nevertheless, there has also been proposed a hybrid magnetic memory element to which an external magnetic field generated by making use of an external-field generation line demanded in the existing MRAM is applied in case the direction of the magnetization of the storage layer cannot be sufficiently inverted by making use of a write current flowing through the hybrid magnetic memory element. This hybrid magnetic memory element is described in document such as Japanese Patent Laid-open No. 2006-210711 (hereinafter, referred to as Patent Document 2).

In accordance with a technology described in Patent Document 2, in an operation to store new bit data in a magnetic memory element over bit data already stored in the magnetic memory element, while a write current is being flowed to the hybrid magnetic memory element, an external-field generation line is used to generate an external magnetic field for helping the write current invert the direction of magnetization. Thus, the hybrid magnetic memory device offers a merit that the direction of the magnetization of the storage layer can be inverted with ease in an operation to store new bit data in a magnetic memory element over bit data already stored in the magnetic memory element.

SUMMARY OF THE INVENTION

As described above, bit data is stored into a magnetic memory element (also referred to as a tunnel magnetic resistance element TMR) of a spin injection memory by letting each of electrons experiencing spin polarization generate a spin torque in the tunnel magnetic resistance element TMR and applying a write voltage to the tunnel magnetic resistance element TMR in order to flow a write current having a magnitude at least equal to a demanded threshold value to the tunnel magnetic resistance element TMR so as to invert the direction of the magnetization state of the storage layer included in the tunnel magnetic resistance element TMR in a spin injection magnetization inversion phenomenon.

On the other hand, an operation to read out bit data from a tunnel magnetic resistance element TMR of the spin injection memory is carried out by detecting the tunnel magnetic resistance effect. That is to say, by detecting a read tunnel current, the magnitude of which is determined by a resistance against the read tunnel current which flows as a result of applying a read voltage to the tunnel magnetic resistance element TMR, it is possible to determine whether the stored bit data has the value of 1 or 0 since the resistance represents the value of the bit data.

As described above, in both the operation to write bit data into a memory cell of the spin injection memory in a spin injection magnetization inversion phenomenon and read out bit data from a memory cell of the memory on the basis of the tunnel magnetic resistance effect, a voltage is applied to the memory cell.

Thus, if the voltage applied to the tunnel magnetic resistance element TMR of a memory cell in a read operation is too large, the read voltage may work inadvertently as a write voltage, increasing the probability that an inadvertent write operation is also carried out unintentionally during the read operation. In the following description, an inadvertent write operation is defined as a write operation carried out unintentionally during a deliberately performed read operation. Also in the following description, the voltage applied to the tunnel magnetic resistance element TMR of a memory cell in a read operation is referred to as a read voltage in order to distinguish the read voltage from a write voltage applied to the tunnel magnetic resistance element TMR in a write operation whereas the so-called inadvertent write probability is defined as the probability that an inadvertent write operation is also carried out unintentionally during a read operation.

If the read voltage is small, on the other hand, the read tunnel current is also small, resulting in a low degree of precision with which a read circuit determines whether the stored bit data is 1 or 0 with. Thus, a read circuit capable of determining whether the stored bit data is 1 or 0 with a high degree of precision for a small read tunnel current is demanded.

It is difficult to avoid an inadvertent write operation (caused by an excessively high read voltage) and assure high read precision (demanding a large read tunnel current and, hence, a high read voltage) at the same time. In addition, in comparison with the existing MRAM, it is more difficult to raise the read voltage in the spin injection memory in an attempt to improve the read precision because the inadvertent write probability of the spin injection memory is higher than that of the MRAM due to the fact that a write operation can be carried out in the spin injection memory at a lower write voltage than that of the MARM.

A semiconductor memory device according to an embodiment of the present invention employs a plurality of magnetic memory elements, a control line group and a read driving circuit. In the semiconductor memory device: each of the magnetic memory elements, which are arranged to form a matrix including a plurality of rows and a plurality of columns, is provided for one of memory cells and includes a storage layer for holding bit data as a direction of the magnetization state of the storage layer; the control line group includes a plurality of first common lines each used for connecting one terminal of each of the memory cells to each other in the row or column direction and includes a plurality of second common lines each used for connecting the other terminal of each of the memory cells to each other in the row or column direction; and the read driving circuit controls electric potentials appearing on the control line group in order to apply a read voltage to selected one of the magnetic memory elements as a voltage resulting in a difference in electric potential between a pair of aforementioned first and second common lines connected to the memory cell including the selected magnetic memory element from which bit data is to be read out and controls an external magnetic field current flowing to the control line group in order to apply an external magnetic field to the selected magnetic memory element in a direction parallel to the direction of the magnetization state of the storage layer included in the selected magnetic memory element.

It is desirable to provide the semiconductor memory device according to the embodiment of the present invention with a configuration in which the read driving circuit generates the external magnetic field in a direction opposite to a direction in which the direction of the magnetization state of the storage layer included in the selected magnetic memory element is to be changed inadvertently by a read current flowing to the selected magnetic memory element as a current resulting from application of the read voltage to the selected magnetic memory element.

In addition, it is also desirable to provide the semiconductor memory device according to the embodiment of the present invention with a configuration in which the read driving circuit is capable of inverting the polarity of the read voltage applied to the selected magnetic memory element as a voltage resulting in a difference in electric potential between a pair of aforementioned first and second common lines connected to the memory cell including the selected magnetic memory element so as to reverse the magnitude relation between the pair of aforementioned first and second common lines and, accompanying reversal of the magnitude relation, capable of inverting the direction of the external magnetic field to an opposite direction parallel to the direction of the magnetization state of the storage layer included in the selected magnetic memory element.

Another semiconductor memory device according to the embodiment of the present invention includes a plurality of memory cells each including a magnetic memory element having a storage layer used for storing bit data as a direction of the magnetization state of the storage layer. New bit data is stored in any particular one of the magnetic memory elements employed in the memory cells over bit data already stored in the particular magnetic memory element by flowing a write current to the storage layer of the particular magnetic memory element in order to invert the direction of the magnetization state of the storage layer included the particular magnetic memory element. In an operation to read out bit data from any specific one of the magnetic memory elements employed in the memory cells, a magnetic field is applied to the specific magnetic memory element in a direction parallel to the direction of the magnetization state of the storage layer included in the specific magnetic memory element.

The embodiment of the present invention also provides a read method for reading out bit data from a semiconductor memory device employing a plurality of memory cells each including a magnetic memory element having a storage layer used for storing bit data as a direction of the magnetization state of the storage layer. New bit data is stored in any particular one of the magnetic memory elements employed in the memory cells over bit data already stored in the particular magnetic memory element by flowing a write current to the storage layer of the particular magnetic memory element in order to invert the direction of the magnetization state of the storage layer included the particular magnetic memory element. The read method is adopted in an operation carried out to read out bit data from any specific one of the magnetic memory elements employed in the memory cells by executing the step of applying a magnetic field to the specific magnetic memory element in a direction parallel to the direction of the magnetization state of the storage layer included in the specific magnetic memory element so as to prevent the magnetization state of the storage layer included in the specific magnetic memory element from being inadvertently inverted.

In accordance with the embodiment of the present invention, in an operation to read out bit data from a magnetic memory element, an external magnetic field parallel to the direction of the magnetization state of a storage layer included in the memory element is applied to the memory element in a direction opposite to a direction in which the direction of the magnetization state of the storage layer included in the memory element is to be changed inadvertently by a read current flowing to the memory element as a current resulting from application of a read voltage to the memory element. Thus, it is possible to prevent an inadvertent write operation from being carried out unintentionally in a memory cell including the magnetic memory element selected as the subject of the data read operation and an unselected memory cells due to inadvertent inversion of the magnetization-state direction. Therefore, the semiconductor memory device offers a merit that it is possible to further raise a read voltage applied to a magnetic memory element in an operation to read out bit data from the memory element by a voltage increase within a range still assuring the prevention of an inadvertent write operation. A higher read voltage is useful for the purpose of increasing the reliability of the read operation whereas an external magnetic field applied in the write operation allows a small write current which is desirable for a miniaturized semiconductor memory device.

BRIEF DESCRIPTION OF THE DRAWINGS

FIGS. 3A to 3D are diagrams each showing a cross section of the structure of the memory cell having the parallel common line type;

FIGS. 10A and 10B are diagrams each showing a relation between the direction of a memory-cell current flowing through the tunnel magnetic resistance element in a write operation and the value of the bit data stored in the tunnel magnetic resistance element as a result of the write operation;

FIGS. 12A to 12H show timing charts of electric potentials appearing on a variety of control lines in a write operation to store bit data having the value of 0 into a memory cell shown in FIG. 11;

FIGS. 13A to 13H show timing charts of electric potentials appearing on a variety of control lines in a write operation to store bit data having the value of 1 into a memory cell shown in FIG. 11;

FIGS. 14A to 14I show timing charts of electric potentials appearing on a variety of control lines in an operation to read out bit data from the memory cell shown in FIG. 11 in a write0 mode;

FIGS. 15A to 15D are diagrams showing four different states of a selected memory cell and an unselected memory cell to both of which an external magnetic field is applied in the same direction in a read operation;

DETAILED DESCRIPTION OF THE PREFERRED EMBODIMENTS

Embodiments of the present invention are described by referring to diagrams as follows.

First Embodiment

A first embodiment implements a semiconductor memory device including external-magnetic-field generation lines.

<Memory Cell Configuration>

Figure 1:
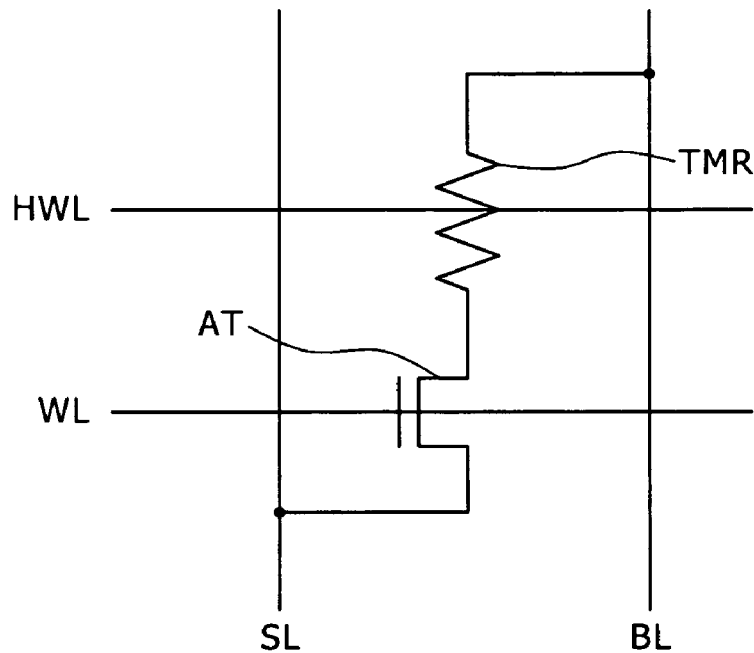
FIG. 1 is a diagram showing an equivalent circuit of a memory cell implemented by an embodiment of the present invention as a memory cell having a parallel common line type connecting the memory cell to a bit line and a source line parallel to the bit line.
Figure 2:
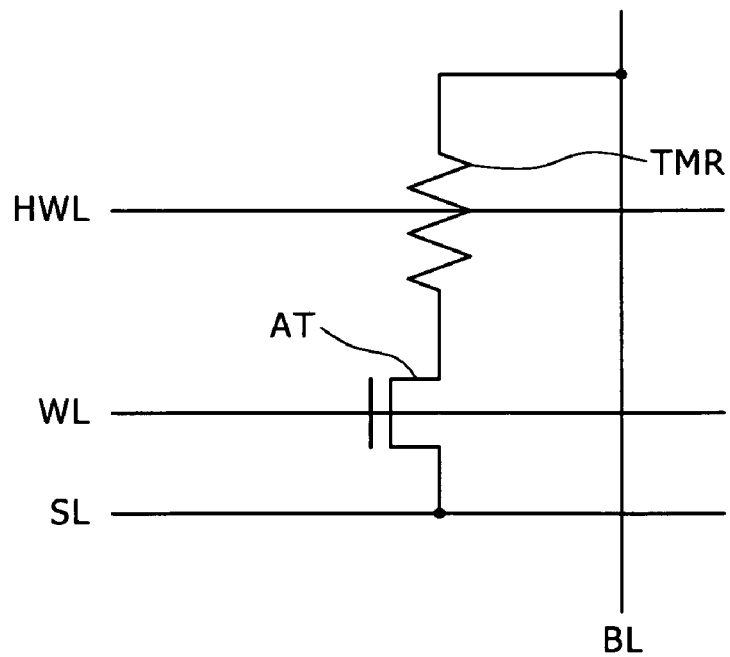
FIG. 2 is a diagram showing an equivalent circuit of a memory cell implemented by an embodiment as a memory cell having an orthogonal common line type connecting the memory cell to a bit line and a source line perpendicular to the bit line.

FIG. 1 is a diagram showing an equivalent circuit of a memory cell MC connected to a bit line BL and a source line SL parallel to the bit line BL. In the following description, such a memory cell MC is referred to as a parallel-common-line memory cell MC. On the other hand, FIG. 2 is a diagram showing an equivalent circuit of a memory cell MC connected to a bit line BL and a source line SL perpendicular to the bit line BL. In the following description, such a memory cell MC is referred to as a memory cell MC of an orthogonal common line type.

The memory cell MC shown in FIGS. 1 and 2 employs a tunnel magnetic resistance element TMR functioning as a magnetic memory element and an access transistor AT.

One terminal of the tunnel magnetic resistance element TMR is connected to the bit line BL whereas the other terminal of the tunnel magnetic resistance element TMR is connected to the drain of the access transistor AT. The source of the access transistor AT is connected to the source line SL whereas the gate of the access transistor AT is connected to a word line WL. An external-magnetic-field generation line HWL for generating a magnetic field to be applied to the tunnel magnetic resistance element TMR is provided typically as a line parallel to the word line WL. It is to be noted that, in the equivalent circuit shown in FIG. 1, the bit line BL is parallel to the source line SL but, in the equivalent circuit shown in FIG. 2, the bit line BL is perpendicular to the source line SL.

The word line WL, each of the external-magnetic-field generation line HWL, the bit line BL and the source line SL is a control line for controlling the memory cell MC. In the specification of the present invention, each of the bit line BL and the source line SL is referred to as a first common line whereas each of the external-magnetic-field generation line HWL and the word line WL is referred to as a second common line.

FIG. 3 is a plurality of diagrams each showing a cross section of the structure of the parallel-common-line memory cell MC whereas FIG. 4 is a plurality of diagrams each showing a cross section of the structure of the orthogonal-common-line memory cell MC. In each of the figures, diagram A is a cross-sectional diagram showing a top view, diagram B is a cross-sectional diagram along a external-magnetic-field generation line HWL and diagram C is a cross-sectional diagram along a bit line BL. FIG. 3D is a cross-sectional diagram along a source line SL. It is to be noted that, in order to make the cross-sectional diagrams easy to view, each the diagrams does not show inter-layer insulation films provided in a multi-layer wiring structure created on a semiconductor substrate 200.

In each of the memory cell MC of the parallel-common-line type and the memory cell MC of the orthogonal-common-line type shown in FIGS. 3 and 4 respectively, an active area 201 activated by introduction of P-type impurity substances is created on the semiconductor substrate 200. The word line WL also used as the gate of the access transistor AT is created over a thin gate oxidation film on the active area 201. It is to be noted that the thin gate oxidation film itself is not shown in the figures. The source area S of the access transistor AT is created by introduction of N-type impurities for the purpose of activation into the active area 201 on one side of the word line WL serving as the gate of the access transistor AT as described above. By the same token, the drain area D of the access transistor AT is created by introduction of N-type impurities for the purpose of activation into the active area 201 on one the other side of the word line WL.

Figure 4A:
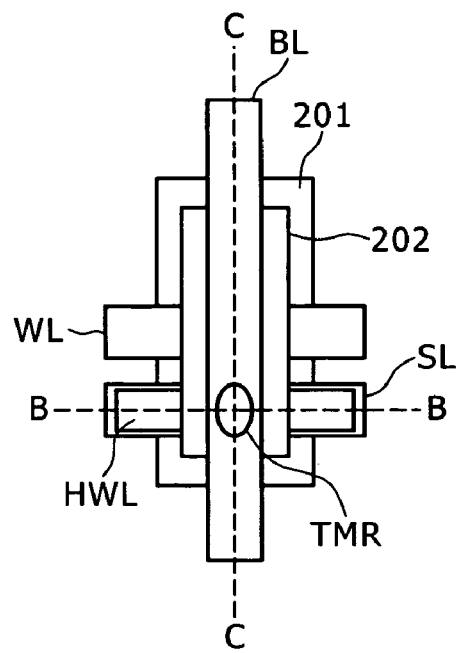
FIGS. 4A to 4C are diagrams each showing a cross section of the structure of the memory cell having the orthogonal common line type.
Figure 4C:
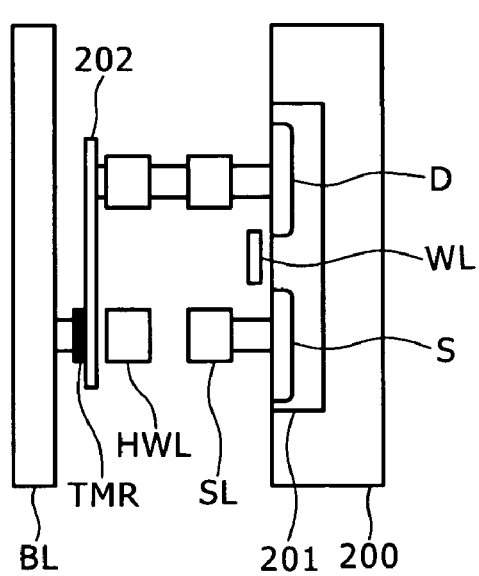

As shown in FIGS. 3D and 4C, the source line SL made from a first metal is connected to the source area S through a plug. On the other hand, in FIGS. 3C and 4C the drain area D is connected sequentially to two landing pad layers made from the first metal and a second metal respectively through two plugs and further connected to the edge on one side of a local wire area 202 on an upper layer through another plug. The local wire area 202 is stretched along the bit line BL. A multi-layer thin film of the tunnel magnetic resistance element TMR is created on the edge on the other side of the local wire area 202. The bit line BL made from a third metal is created on the upper surface of the tunnel magnetic resistance element TMR. The bit line BL is parallel to the local wire area 202 and, thus, perpendicular to the word line WL.

Figure 4B:
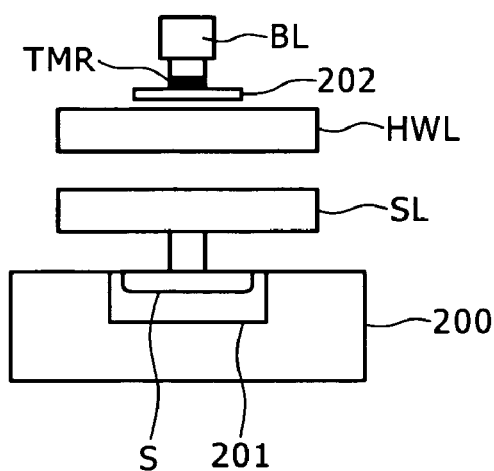

The external-magnetic-field generation line HWL made from the second metal is provided in close proximity to the word line WL on a particular side of the local wire area 202, that is, a side opposite to the side on which the tunnel magnetic resistance element TMR is provided. In FIGS. 3B and 4B, the particular side is the lower side of the local wire area 202. The external-magnetic-field generation line HWL is oriented in a direction parallel to the direction of the word line WL. By providing the external-magnetic-field generation line HWL in this way, an external magnetic field generated by the external-magnetic-field generation line HWL can be applied to the tunnel magnetic resistance element TMR with a high degree of efficiency.

In FIGS. 3A and 4A, the tunnel magnetic resistance element TMR is shown to have a shape similar to that of an ellipse. The direction of the long axis of the ellipse is a direction in which the reversible magnetization state of the storage layer is easy to orient whereas the direction of the short axis of the ellipse is a direction in which the reversible magnetization state of the storage layer is difficult to orient.

It is to be noted that the cross sections of the structures shown in FIGS. 3 and 4 are typical and, hence, implementations of the embodiment of the present invention are by no means limited to the typical cross-sectional structures shown in these figures.

Next, the structure and electrical characteristic of the tunnel magnetic resistance element TMR are explained.

Figure 5:
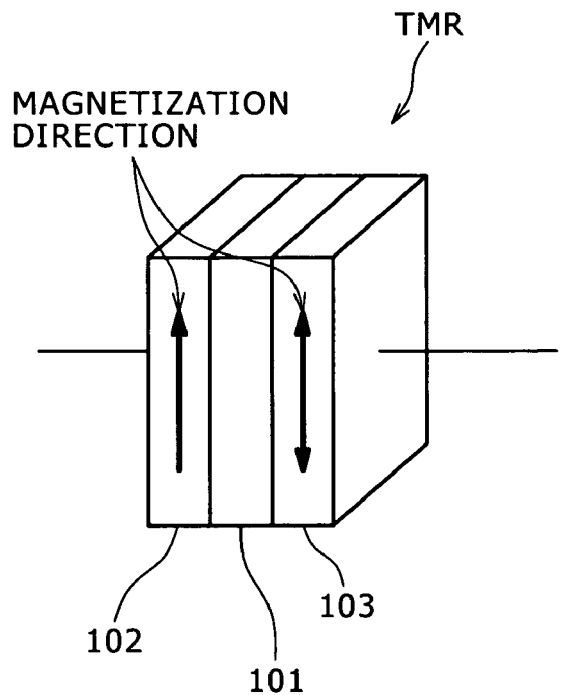
FIG. 5 is a diagram showing the basic structure of a tunnel magnetic resistance element.

FIG. 5 is a diagram showing the basic structure of the tunnel magnetic resistance element TMR.

As shown in FIG. 5, the basic structure of the tunnel magnetic resistance element TMR is the structure of a stacked-layer body including 2 magnetic-substance layers 102 and 103 separated away from each other by a tunnel barrier layer 101. The fixed-magnetization layer 102 is a layer designed to have a fixed state of magnetization. On the other hand, the storage layer 103 is a layer having a changeable direction of magnetization. To be more specific, the storage layer 103 is a layer so designed that the direction of the magnetization state of the storage layer 103 can be changed from the same direction as that of the fixed-magnetization layer 102 to a direction opposite to that of the fixed-magnetization layer 102 and vice versa. That is to say, the direction of the magnetization state of the storage layer 103 can be changed from a direction matching that of the fixed-magnetization layer 102 to a direction forming an angle of 180 degrees in conjunction with that of the fixed-magnetization layer 102 and vice versa.

The stacked-layer film having the two magnetic-substance layers (i.e., the fixed-magnetization layer 102 and the storage layer 103) exhibits an MR (magnetic resistance) effect of a specific electric conductivity changing in accordance with the angle formed by the magnetization-state directions of the layers. Bit data is read out from the stacked-layer film in a read operation by applying a read voltage between both the terminals of the film including the two magnetic-substance layers and then detecting a read tunnel current flowing through the film. The magnitude of the read tunnel current is determined by a tunnel resistance which changes in accordance with the direction of the magnetization state of the storage layer 103 as a phenomenon of the MR effect and the direction of the magnetization state of the storage layer 103 represents the value of bit data stored in the storage layer 103. The magnitude of the read tunnel current thus indicates the value of the bit data read out from the stacked-layer film. Instead of detecting the magnitude of the read tunnel current, a change of an electric potential generated by the current can also be detected as well in the read operation. The MR effect of a tunnel current flowing through a tunnel magnetic resistance element TMR is referred to as a TMR effect of the tunnel magnetic resistance element TMR.

If an excessively large read tunnel current flows through a tunnel magnetic resistance element TMR in a read operation, the direction of spin injection magnetization may be reversed in the so-called inadvertent write operation, unintentionally inverting the value of the already stored bit data being read out. The inversion of the direction of the spin injection magnetization is inversion caused inadvertently by the flowing read tunnel current. If the direction of spin injection magnetization is reversed, the electrical memory characteristic of the tunnel magnetic resistance element TMR changes. By the electrical memory characteristic of a tunnel magnetic resistance element TMR, the hysteresis characteristic of the resistance of the tunnel magnetic resistance element TMR is meant.

Figure 6:
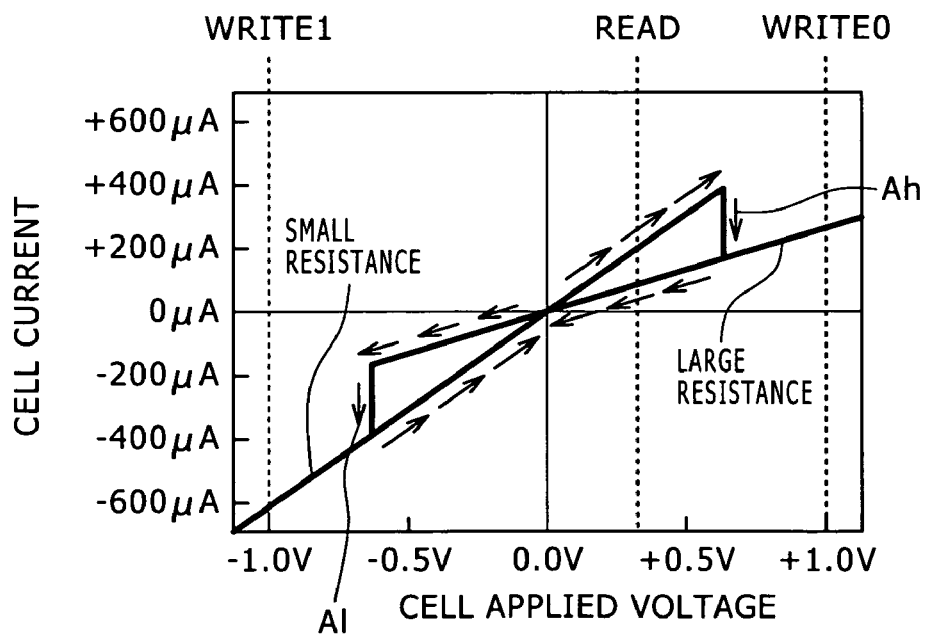
FIG. 6 is a diagram showing a graph representing the current-voltage characteristic of the tunnel magnetic resistance element.

FIG. 6 is a diagram showing a graph representing the current-voltage characteristic (the electrical memory characteristic) of the tunnel magnetic resistance element TMR as the hysteresis characteristic mentioned above. The direction in which a current flows from the fixed-magnetization layer 102 to the storage layer 103 shown in FIG. 5 is the positive direction of a memory cell current represented by the upper side of the vertical axis of the graphs shown in FIG. 6. Thus, the direction in which a current flows from the storage layer 103 to the fixed-magnetization layer 102 is the negative direction of the memory cell current represented by the lower side of the vertical axis. The horizontal axis of the graphs shown in FIG. 6 represents the voltage applied to the fixed-magnetization layer 102 as a voltage relative to the electric potential appearing on the storage layer 103, be the voltage applied in a deliberate write operation or an inadvertent write operation carried out unintentionally in a read operation as described above. That is to say, the right-hand side of the horizontal axis represents the positive memory-cell applied voltage higher than the reference electric potential appearing on the storage layer 103 whereas the left-hand side of the horizontal axis represents the negative memory-cell applied voltage lower than the reference electric potential.

The electrical characteristic shown in FIG. 6 includes a graph passing through a zero point to represent an L (low) resistance state providing a low resistance of the fixed-magnetization layer 102 and another graph passing through the same zero point to represent an H (high) resistance state providing a high resistance of the fixed-magnetization layer 102. If the memory-cell applied voltage is increased in the L (low) resistance state in the range +0.5 to +1 [V] for example, a state transition shown by an arrow Ah in FIG. 6 occurs to result in a transition to the H resistance state. If the memory-cell write voltage is decreased in the H resistance state in the range −0.5 to −1 [V] for example, on the other hand, a state transition shown by an arrow Al in FIG. 6 occurs to result in a transition to the L resistance state.

In an actual write operation carried out on the memory cell MC, the transition to the H resistance state is made for example by setting the memory-cell write voltage at +1.0 [V] whereas the transition to the L resistance state is made for example by setting the memory-cell write voltage at −1.0 [V].

The H and L resistance states of the electrical characteristic of a memory cell MC are associated with respectively the two values of the bit data. Since a transition from any one of the states to the other can occur as shown in FIG. 6, it is obvious that bit data can be newly written over bit data already stored in the memory cell MC as new bit data having a value different from that of the bit data already stored in the memory cell MC. To put it concretely, by setting the memory-cell write voltage at +1.0 [V] in a write operation for example, the transition to the H resistance state is made to represent an operation to write new bit data having the value of 0 into the memory cell MC over already stored bit data having the value of 1 in the so-called write0 operation. By setting the memory-cell write voltage at −1.0 [V] in a write operation, on the other hand, the transition to the L resistance state is made to represent an operation to write new bit data having the value of 1 into the memory cell MC over already stored bit data having the value of 0 in the so-called write1 operation.

In an operation to read out data from a memory cell MC, a memory-cell read voltage of an electric potential state providing an MR (magnetic resistance) ratio which is large to a certain degree is applied to the memory cell MC. The MR ratio is the ratio of the resistance of the tunnel magnetic resistance element TMR in the H resistance state to the resistance of the tunnel magnetic resistance element TMR in the L resistance state. An example of such a memory-cell read voltage is a voltage of about 0.3 [V]. When the memory-cell read voltage is applied to the memory cell MC, the tunnel magnetic resistance element TMR employed in the memory cell MC displays a resistance which depends on whether the storage layer 103 of the tunnel magnetic resistance element TMR has been put in the H or L resistance state. Thus, by detecting the resistance of the tunnel magnetic resistance element TMR employed in the memory cell MC in a read operation, it is possible to determine whether the write state of the fixed-magnetization layer 102 is the H resistance state in which bit data having the value of 0 has already been 'typically' stored in the storage layer 103 employed in the memory cell MC or the L resistance state in which bit data having the value of 1 has already been 'typically' stored in the storage layer 103. It is to be noted, however, that this association of the resistance states of the tunnel magnetic resistance element TMR with the values of the bit data stored in the tunnel magnetic resistance element TMR is typical. That is to say, the H resistance state can be associated with bit data having the value of 1 whereas the L resistance state can be associated with bit data having the value of 0.

The aforementioned memory-cell read voltage of 0.3 [V] in the typical read operation described above is a read voltage applied to the memory cell MC in a write0 mode. In the write0 mode, the read operation is carried out by flowing a current through the tunnel magnetic resistance element TMR in the same direction as a write operation to store bit data having the value of 0 into the tunnel magnetic resistance element TMR of the memory cell MC. In a write operation to store bit data having the value of 0 into the tunnel magnetic resistance element TMR, bit data having the value of 0 needs to be newly stored in the memory cell MC over already stored bit data having the value of 1 by making a transition to the H resistance state. In a write1 mode, on the other hand, the read operation is carried out by flowing a current through the tunnel magnetic resistance element TMR in the same direction as a write operation to store bit data having the value of 1 into the tunnel magnetic resistance element TMR of the memory cell MC. In a write operation to store bit data having the value of 1 into the tunnel magnetic resistance element TMR, bit data having the value of 1 needs to be newly stored in the memory cell MC over already stored bit data having the value of 0 by making a transition to the L resistance state. In the write1 mode, a memory-cell read voltage of typically −0.3 [V] is applied to the memory cell MC in a read operation. That is to say, the direction of a current flowing through the memory cell MC in a read operation carried out in the write1 mode is exactly opposite to the direction of a current flowing through the memory cell MC in a read operation carried out in the write0 mode. It is to be noted that the direction of the current flowing through the memory cell MC in a read operation carried out in either the write0 mode or the write1 mode is perpendicular to the directions shown in FIG. 5 as magnetization directions of the fixed-magnetization layer 102 and the storage layer 103. In other words, electrons of the current flowing through the memory cell MC can be injected from the fixed-magnetization layer 102 to the storage layer 103 or, reversely, from the fixed-magnetization layer 102 to the storage layer 103.

If the difference between the resistance displayed by the tunnel magnetic resistance element TMR already put in the L resistance state in the read operation and the resistance displayed by the tunnel magnetic resistance element TMR already put in the H resistance state in the read operation is large, that is, if the MR ratio is large, it becomes easier to distinguish the L resistance state corresponding to bit data having the value of 1 and the H resistance state corresponding to bit data having the value of 0 from each other. Thus, in the read operation, it is desirable to apply a memory-cell read voltage having a large absolute magnitude. That is to say, the larger the absolute magnitude of the memory-cell read voltage, the more reliable the read operation. If the absolute magnitude of the memory-cell read voltage is excessively large, however, it becomes impossible to assure a margin between the memory-cell read voltage and a transition voltage causing a state transition from the L resistance state to the H resistance state or vice versa. If such a margin may not be assured, it is quite within the bounds of possibility that an inadvertent write operation is carried out unintentionally on all memory cells MC connected to the same bit line BL as the memory cell MC on which the read operation is being performed. Such an inadvertent write operation is referred to as a read disturbance. In order to prevent a read disturbance from occurring, it is necessary to control the memory-cell read voltage with a high degree of precision in a read operation. In addition, if the MR ratio exhibits a property of dependence on the memory-cell read voltage, it is necessary to carry out the read operation under a condition of an assured large MR ratio.

As will be described later in detail, an external magnetic field generated by the external-magnetic-field generation line HWL shown in FIGS. 1 and 2 is applied to a memory cell MC, on which a read operation is carried out, in order to relieve the memory cell MC from the restrictions imposed on the memory-cell read voltage, that is, in order to prevent a read disturbance from occurring. From another point of view, the embodiment of the present invention assures a necessary read disturbance margin, contributing to simplification of a read circuit and reduction of the area occupied by the memory cell MC.

The embodiment is characterized in that an external magnetic field is applied to a memory cell MC in an operation to read out bit data from the memory cell MC. A peripheral circuit section for driving a control line group provided for the memory array (or the matrix of memory cells MC) takes charge of the control of the memory array. As described earlier, the control line group includes the word line WL, the external-magnetic-field generation line HWL, the bit line BL and the source line SL.

The following description explains the entire configuration of the semiconductor memory device including the peripheral circuit section and a concrete typical driving circuit.

It is to be noted that, in the following description, the configuration of a memory cell MC of the parallel common line type is assumed. A memory cell MC of the orthogonal common line type is different from the memory cell MC of the parallel common line type in that the layout of the peripheral circuit section for the parallel common line type is different from that for the parallel common line type. Except this difference, the memory cell MC of the orthogonal common line type has a driving method basically identical with that of the memory cell MC of the parallel common line type. Thus, the following description can be applied analogically to the memory cell MC of the orthogonal common line type.

<Entire Configuration>

Figure 7:
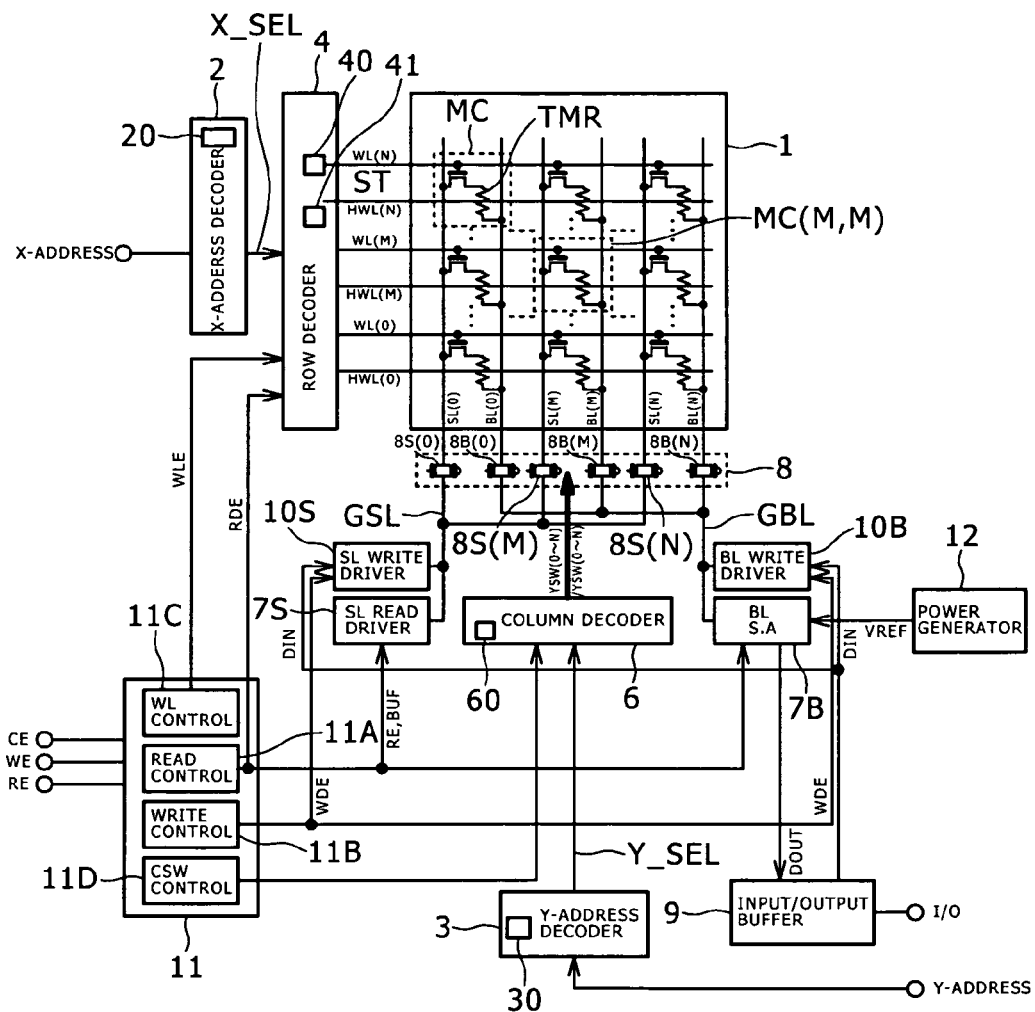
FIG. 7 is a block diagram showing a semiconductor memory device according to the embodiment.

FIG. 7 is a block diagram showing a semiconductor memory device having a memory-array (or matrix) configuration composing of (N+1) rows and (N+1) columns. The semiconductor memory device shown in FIG. 7 employs a memory array 1 and a peripheral-circuit section including peripheral circuits for the memory array 1. The memory array 1 is a matrix of memory cells MC each shown in FIG. 1. The memory cells MC are arranged to form the matrix composing of (N+1) rows and (N+1) columns. It is to be noted that notation N denotes any positive integer even though the number of rows may be different from the number of columns.

The word line WL shown in FIG. 1 is connected to (N+1) memory cells MC arranged on a row in the entire memory array 1 shown in FIG. 7 as a line common to the memory cells MC. By the same token, the external-magnetic-field generation line HWL shown in FIG. 1 is connected to (N+1) memory cells MC arranged on a row in the entire memory array 1 shown in FIG. 7 as a line common to the memory cells MC.

To put it concretely, as a line common to (N+1) memory cells MC arranged on a row, the word line WL is connected to the gate of an access transistor AT employed in each of the memory cells MC. Since there are (N+1) rows, there are also (N+1) word lines WL (i.e., word lines WL (0) to WL (N)) which are arranged in the column direction by being separated away from each other by a distance determined in advance. By the same token, as a line common to (N+1) memory cells MC arranged on a row, the external-magnetic-field generation line HWL is stretched over a location in close proximity to a tunnel magnetic resistance element TMR employed in each of the memory cells MC. Since there are (N+1) rows, there are also (N+1) external-magnetic-field generation lines HWL (i.e., external-magnetic-field generation lines HWL (0) to HWL (N)) which are arranged in the column direction by being separated away from each other by a distance determined in advance.

By the same token, the bit line BL shown in FIG. 1 is connected to (N+1) memory cells MC arranged on a column in the entire memory array 1 shown in FIG. 7 as a line common to the memory cells MC. In the same way, the source line SL shown in FIG. 1 is connected to (N+1) memory cells MC arranged on a column in the entire memory array 1 shown in FIG. 7 as a line common to the memory cells MC.

To put it concretely, as a line common to (N+1) memory cells MC arranged on a column, the bit line BL is connected to a specific one of the terminals of a tunnel magnetic resistance element TMR employed in each of the memory cells MC. Since there are (N+1) columns, there are also (N+1) bit lines BL (i.e., bit lines BL (0) to BL (N)) which are arranged in the row direction by being separated away from each other by a distance determined in advance. By the same token, as a line common to (N+1) memory cells MC arranged on a column, the source line SL is connected to the source of an access transistor AT employed in each of the memory cells MC. Since there are (N+1) columns, there are also (N+1) source lines SL (i.e., source lines SL (0) to SL (N)) which are arranged in the row direction by being separated away from each other by a distance determined in advance. The other terminal of the tunnel magnetic resistance element TMR is connected to the drain of the access transistor AT. It is to be noted that the specific terminal of a tunnel magnetic resistance element TMR is a terminal on a side opposite to the side on which an access transistor AT is provided in the same memory cell MC as the tunnel magnetic resistance element TMR.

The peripheral-circuit section includes an X-address decoder 2, a Y-address decoder 3, a row decoder 4, a column decoder 6, a BLSA (bit-line sense amplifier) 7B, a SLRD (source-line read driver) 7S, a column select switch circuit 8, an input/output buffer (or an I/O buffer) 9, a bit-line write driver (or a BL write driver) 10B, a source-line write driver (or an SL write driver) 10S, a control circuit 11 and a driving-power generation circuit (or a power generator) 12.

A control circuit for controlling the electric potentials appearing on a group of control lines in a read operation or for controlling the direction of a current flowing through a control line determined in advance in the read operation include at least the row decoder 4, the column decoder 6, the bit-line sense amplifier 7B, the source-line read driver 7S and the column select switch circuit 8. This control circuit is a typical embodiment of a read driving circuit according to the embodiment of the present invention. It is to be noted that the read driving circuit may also include blocks each used for generating a signal and/or a voltage, which are utilized for controlling the row decoder 4, the column decoder 6, the bit-line sense amplifier 7B, the source-line read driver 7S and the column select switch circuit 8. The voltage generated by a block may be a data voltage. Examples of the blocks are the X-address decoder 2, the Y-address decoder 3, the input/output buffer 9, the control circuit 11 and the driving-power generation circuit 12.

The X-address decoder 2 has a configuration in which an X selector 20 serves the main basic unit. The X-address decoder 2 is a circuit for decoding a received X-address signal X-Address and providing the row decoder 4 with an X-select signal X_SEL determined on the basis of the result of the decoding.

By the same token, the Y-address decoder 3 has a configuration in which a Y selector 30 serves as the main basic unit. The Y-address decoder 3 is a circuit for decoding a received Y-address signal Y-Address and providing the column decoder 6 with a Y-select signal Y_SEL determined on the basis of the result of the decoding.

The row decoder 4 includes (N+1) row decoder units 40 each serving as a main basic unit provided for a word line WL. The outputs of the row decoder units 40 are connected to their respective (N+1) word lines WL (i.e., the word lines WL (0) to WL (N). In accordance with an X select signal X_SEL received from the X-address decoder 2, one of the row decoder units 40 is selected. The selected row decoder unit 40 asserts a voltage determined in advance on the word line WL connected to the output of the selected row decoder unit 40.

In addition, the row decoder 4 also includes (N+1) magnetic-field current driver units 41 each serving as another main basic unit provided for an external-magnetic-field generation line HWL. The magnetic-field current driver units 41 each serve as a driving circuit for flowing an external magnetic field current to an external-magnetic-field generation line HWL connected to the magnetic-field current driver unit 41. To put it concretely, the outputs of the magnetic-field current driver units 41 are connected to their respective (N+1) external-magnetic-field generation line HWLs (i.e., the external-magnetic-field generation lines HWL (0) to HWL (N). In accordance with the X select signal X_SEL received from the X-address decoder 2, one of the magnetic-field current driver units 41 is selected. The selected magnetic-field current driver unit 41 flows an external magnetic field current to the external-magnetic-field generation line HWL connected to the output of the selected magnetic-field current driver unit 41. The current generated by the magnetic-field current driver unit 41 is an external magnetic field current for generating an external magnetic field in each of memory cell MCs connected to the external-magnetic-field generation line HWL connected to the output of the selected magnetic-field current driver unit 41. However, the selected magnetic-field current driver unit 41 flows an external magnetic field current to the external-magnetic-field generation line HWL connected to the output of the selected magnetic-field current driver unit 41 only while a read-enable signal RDE received by the row decoder 4 from the control circuit 11 is in an activated state.

It is desirable to provide a configuration in which each of the magnetic-field current driver units 41 is capable of inverting the direction of the external magnetic field current flowed to the external-magnetic-field generation line HWL connected to the output of the magnetic-field current driver unit 41.

In the semiconductor memory device shown in FIG. 7, the other end of each of the external-magnetic-field generation lines HWL is in an unconnected state. The other end of an external-magnetic-field generation line HWL is the end on a side opposite to the side on which the row decoder 4 is located. In actuality, however, the other end of each of the external-magnetic-field generation lines HWL is connected to a common line because each of the external-magnetic-field generation lines HWL is used for flowing a current. In order for the magnetic-field current driver unit 41 to invert the direction of the external magnetic field current flowed to an external-magnetic-field generation line HWL, for example, the magnetic-field current driver unit 41 may adopt a typical technique to change a voltage applied by the magnetic-field current driver unit 41 to the external-magnetic-field generation line HWL from a voltage level higher than a reference voltage appearing on the common line to a voltage level lower than the reference voltage or vice versa.

The direction of the current for generating an external magnetic field will be described in detail later. Anyway, it is desirable to determine the direction of the current for generating an external magnetic field in accordance with the direction of a memory-cell read current flowed through a memory cell in which the external magnetic field is to be generated.

By the same token, the column decoder 6 has a configuration in which each YSW gate circuit 60 serves as a main basic unit. The column decoder 6 is a circuit for decoding a Y-select signal Y_SEL received from the Y-address decoder 3 and selecting a YSW gate circuit 60 on the basis of the result of the decoding. The selected YSW gate circuit 60 provides the column select switch circuit 8 with a Y switch signal YSW and an inverted Y switch signal/YSW as control signals. The inverted Y switch signal/YSW is a signal obtained by inverting the Y switch signal YSW.

The column select switch circuit 8 includes at least 2(N+1) transmission gates TG each serving as a main basic unit provided for a source line SL or a bit line BL. Each of the transmission gates TG employs an NMOS transistor and a PMOS transistor. The source of the NMOS transistor is connected to the source of the PMOS transistor whereas the drain of the NMOS transistor is connected to the drain of the PMOS transistor. In the semiconductor memory device shown in FIG. 7, the 2(N+1) transmission gates TG are transmission gates TG 8S (0) and 8B (0) to 8S (N) and 8B (N). Each of the transmission gates TG 8S (0) to 8S (N) composing one half of the transmission gates TG is connected to a source line SL. Each of the transmission gates TG 8S (0) to 8S (N) is referred to as a source-line TG 8S. On the other hand, each of the transmission gates TG 8B (0) to 8B (N) composing the remaining half of the transmission gates TG is connected to a bit line BL. Each of the transmission gates TG 8B (0) to 8B (N) is referred to as a bit-line TG 8S.

One particular end of each of the source-line transmission gates TG 8S (0) to 8S (N) is connected to a global source line GSL common to the source-line transmission gates TG 8S (0) to 8S (N). The particular end of each of the source-line transmission gates TG 8S (0) to 8S (N) is the end on a side opposite to the side on which the memory array 1 is located. The source-line transmission gates TG 8S (0) to 8S (N) control the connection between the global source line GSL and the (N+1) source lines SL, i.e., the source lines SL (0) to SL (N).

The global source line GSL is connected to the source-line read driver 7S and the source-line write driver 10S.

By the same token, one particular end of each of the bit-line transmission gates TG 8B (0) to 8B (N) is connected to a global bit line GBL common to the bit-line transmission gates TG 8B (0) to 8B (N). The particular end of each of the bit-line transmission gates TG 8B (0) to 8B (N) is the end on a side opposite to the side on which the memory array 1 is located. The bit-line transmission gates TG 8B (0) to 8B (N) control the connections between the global bit line GBL and the (N+1) bit lines BL.

The global bit line GBL is connected to the bit-line sense amplifier 7B and the bit-line write driver 10B.

The control circuit 11 receives three enable signals, i.e., a chip enable signal CE, a write enable signal WE and a read enable signal RE. The control circuit 11 employs four control circuits operating on the basis of the chip enable signal CE, the write enable signal WE and the read enable signal RE. The four control circuits are a read control circuit 11A, a write control circuit 11B, a WL (write line) control circuit 11C and a CS (column switch) control circuit 11D. The read control circuit 11A is a control circuit for controlling the source-line read driver 7S and the bit-line sense amplifier 7B in a read operation. The write control circuit 11B is a control circuit for controlling the source-line write driver 10S and the bit-line write driver 10B in a write operation. The write-line control circuit 11C is a control circuit for controlling the row decoder 4 in read and write operations. The column-switch control circuit 11D is a control circuit for controlling the column select switch circuit 8 through the column decoder 6 in read and write operations.

It is to be noted that, in the semiconductor memory device shown in FIG. 7, a variety of control signals generated by the read control circuit 11A, the write control circuit 11B, the write-line control circuit 11C and the column-switch control circuit 11D are merely denoted by notations assigned to the control signals respectively. Details of the control signals generated by the read control circuit 11A, the write control circuit 11B, the write-line control circuit 11C and the column-switch control circuit 11D will be described later.

The driving-power generation circuit 12 is a circuit for receiving power from a power supply and generating a variety of voltages from the voltage of the power. Nonetheless, FIG. 7 shows only a reference voltage VREF which is one of the generated voltages. The driving-power generation circuit 12 supplies the reference voltage VREF to the bit-line sense amplifier 7B. In actuality, however, it is possible to provide a configuration in which the driving-power generation circuit 12 generates a variety of voltages other than the reference voltage VREF and supplies the other voltages to circuits other than the bit-line sense amplifier 7B.

<Read and Write Circuits>

Figure 8:
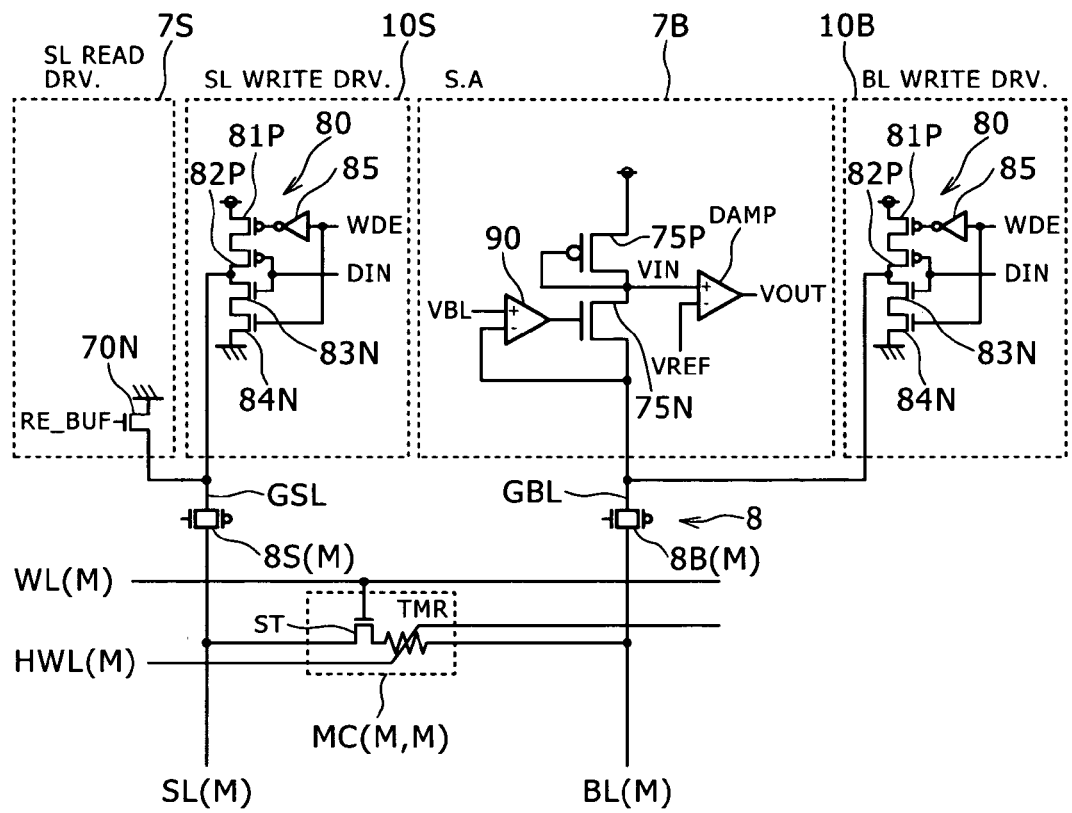
FIG. 8 is a diagram showing connections between some peripheral circuits and memory cells.

FIG. 8 is a diagram showing typical concrete connections of the bit-line sense amplifier 7B, the source-line read driver 7S, the bit-line write driver 10B and the source-line write driver 10S to memory cells MC (M, M).

The memory cell MC (M, M) shown in FIG. 8 is a memory cell MC at an X address corresponding to the Mth row and a Y address corresponding to the Mth column in the memory array 1 shown in FIG. 7. The memory cell MC (M, M) is a memory cell MC in the memory array 1 employed in the semiconductor memory device shown in FIG. 1. The value of M is an integer in the range 0 to N, that is, an integer equal to or greater than 0 and equal to or smaller than N. In addition, the value of M for the number of a row can be selected arbitrarily and independently of the value of M for the number of a column. The memory cell MC (M, M) is connected to a word line WL (M), an external-magnetic-field generation line HWL (M), a bit line BL (M) and a source line SL (M). As described earlier, the external-magnetic-field generation line HWL connected to a memory cell MC is a line for applying an external magnetic field in the tunnel magnetic resistance element TMR employed in the memory cell MC in a read (and/or write) operation to be described later.

A bit-line TG 8B (M) is provided between the bit line BL (M) and the global bit line GBL. By the same token, a source-line TG 8S (M) is provided between the source line SL (M) and the global source line GSL.

The bit-line write driver 10B employs a write driver 80.

The write driver 80 is a circuit for outputting inverted input data/DIN held in a write latch circuit employed in the input/output buffer 9 to the global bit line GBL in accordance with a signal WDE received from the write control circuit 11B employed in the semiconductor memory device shown in FIG. 7.

As shown in FIG. 8, the write driver 80 employs two PMOS transistors 81P and 82P, two NMOS transistors 83N and 84N as well as an inverter 85. The PMOS transistors 81P and 82P as well as the NMOS transistors 83N and 84N are connected to each other to form a series circuit between a power-supply voltage line and a reference voltage line such as a ground line. The gate of the PMOS transistor 82P is connected to the gate of the NMOS transistor 83N and these gates receive the inverted input data/DIN. The junction point between the drains of the PMOS transistor 82P and the NMOS transistor 83N is connected the global bit line GBL. The PMOS transistor 81P, the NMOS transistor 84N and the inverter 85 control power received from a power supply in accordance with the signal WDE supplied to the input of the inverter 85.

The source-line write driver 10S also employs a write driver 80 identical with the write driver 80 of the bit-line write driver 10B. However, the write driver 80 employed in the source-line write driver 10S is a circuit for outputting input data DIN held in the write latch circuit employed in the input/output buffer 9 to the global source line GSL in accordance with the signal WDE received from the write control circuit 11B employed in the semiconductor memory device shown in FIG. 7. Thus, in the write driver 80 employed in the source-line write driver 10S, the gate of the PMOS transistor 82P and the gate of the NMOS transistor 83N receive the input data DIN as shown in FIG. 8. The junction point between the drains of the PMOS transistor 82P and the NMOS transistor 83N is connected the global source line GSL.

As is understood from the above description, the write driver 80 employed in the source-line write driver 10S and the write driver 80 employed in the bit-line write driver 10B operate as a differential circuit. When the write driver 80 employed in the bit-line write driver 10B drives the global bit line GBL to a high level, the write driver 80 employed in the source-line write driver 10S drives the global source line GSL to a low level. When the write driver 80 employed in the bit-line write driver 10B drives the global bit line GBL to a low level, on the other hand, the write driver 80 employed in the source-line write driver 10S drives the global source line GSL to a high level.

As shown in FIG. 8, the source-line read driver 7S operates on the basis of signals such as a signal RE_BUF received from the read control circuit 11A shown in FIG. 7. On the other hand, the bit-line sense amplifier 7B operates on the basis of the reference voltage VREF received from the driving-power generation circuit 12 shown in FIG. 7.

As shown in FIG. 8, the source-line read driver 7S employs an NMOS transistor 70N between the global source line GSL and an electric potential appearing on the ground (GND). The signal RE_BUF is supplied to the gate of the NMOS transistor 70N. Thus, when the signal RE_BUF is active during a read operation period, the NMOS transistor 70N is in an on state connecting the global source line GSL to the electric potential appearing on the ground.

FIG. 8 shows only the basic configuration of the bit-line sense amplifier 7B.

To put it concretely, the basic configuration of the bit-line sense amplifier 7B has a PMOS transistor 75P, an NMOS transistor 75N, a negative feedback amplifier 90 and a differential sense amplifier DAMP.

The differential sense amplifier DAMP is a sense amplifier having an inverted input '−' for receiving the reference voltage VREF and an uninverted input '+' for receiving an input voltage VIN from the PMOS transistor 75P.

The PMOS transistor 75P is connected between a node for holding the input voltage VIN and the power-supply line. The gate and drain of the PMOS transistor 75P are connected to each other to form a pull-up diode. The PMOS transistor 75P also functions as a load to be borne by the NMOS transistor 75N as well. On the other hand, the NMOS transistor 75N is connected between the node for holding the input voltage VIN and the global bit line GBL.

The negative feedback amplifier 90 is a circuit for controlling the voltage of the global bit line GBL to a fixed bit-line voltage VBL.

The inverted input '−' of the negative feedback amplifier 90 is connected to the source of the NMOS transistor 75N as well as the global bit line GBL whereas the uninverted input '+' of the negative feedback amplifier 90 is sustained at the fixed bit-line voltage VBL. The output of the negative feedback amplifier 90 is connected to the gate of the NMOS transistor 75N.

In an operation to read out data from a memory cell MC (M, M), the bit-line sense amplifier 7B having such a configuration sustains the global bit line GBL at the fixed bit-line voltage VBL and, at the same time, applies the bit-line voltage VBL to the memory cell MC (M, M) as a driving voltage for flowing a memory-cell current Icell to the memory cell MC (M, M) from the global bit line GBL to the global source line GSL in the so-called write0 mode. In a read operation carried out in the write0 mode, the memory-cell current Icell flows in the same direction as a write0 operation to store bit data having the value of 0 into the memory cell MC (M, M) as will be described later by referring to FIG. 12. At that time, the NMOS transistor 75N having the PMOS transistor 75P as a load flows the memory-cell current Icell so that the memory-cell current Icell appears as an electric-potential drop through the PMOS transistor 75P, changing the input voltage VIN in accordance with the magnitude of the memory-cell current Icell. In other words, the NMOS transistor 75N changes the input voltage VIN by the electric-potential drop. That is to say, the electric-potential drop equal to the change of the input voltage VIN is determined in accordance with the memory-cell current Icell flowing to the memory cell MC (M, M).

The differential sense amplifier DAMP detects the magnitude relation between the fixed reference voltage VREF and the input voltage VIN, amplifying the difference between the fixed reference voltage VREF and the input voltage VIN to generate an output Vout, which is a signal having the amplitude of the power-supply voltage in accordance with a result of the detection. That is to say, the differential sense amplifier DAMP generates the output Vout in accordance with the memory-cell current Icell flowing to the memory cell MC (M, M). By the way, since the bit-line voltage VBL applied to the memory cell MC (M, M) is a fixed voltage, the memory-cell current Icell is determined by the resistance of the tunnel magnetic resistance element TMR employed in the memory cell MC (M, M). As described before, the resistance of the tunnel magnetic resistance element TMR is determined by the logic (or the value) of the bit data stored in the memory cell MC (M, M). That is to say, the resistance of the tunnel magnetic resistance element TMR is determined by whether the stored bit data has the value of 0 or 1. Thus, the stored bit data is supplied to the bit-line sense amplifier 7B as a difference in memory-cell current Icell between bit data having the value of 0 and bit data having the value of 1 and, as described above, the difference in memory-cell current Icell is converted by the NMOS transistor 75N into a change in electric-potential drop or a change in input voltage VIN. Then, the change in input voltage VIN appears to the differential sense amplifier DAMP as a difference between the input voltage VIN and the fixed reference voltage VREF. Finally, the differential sense amplifier DAMP amplifies the difference between the input voltage VIN and the reference voltage VREF to the output Vout.

It is to be noted that the electric potential appearing at the node for holding the input voltage VIN needs to be initialized in advance by a pre-charging process carried out prior to the operation to read out bit data from the memory cell MC. However, a configuration for initializing the node is omitted from the figure.

<Definition of Data and Magnetization Directions>

By referring to FIG. 5, the following description explains the definitions of bit data having the values of 1 and 0 as well as the definitions of the directions of magnetization.

Figures 9A, 9B:
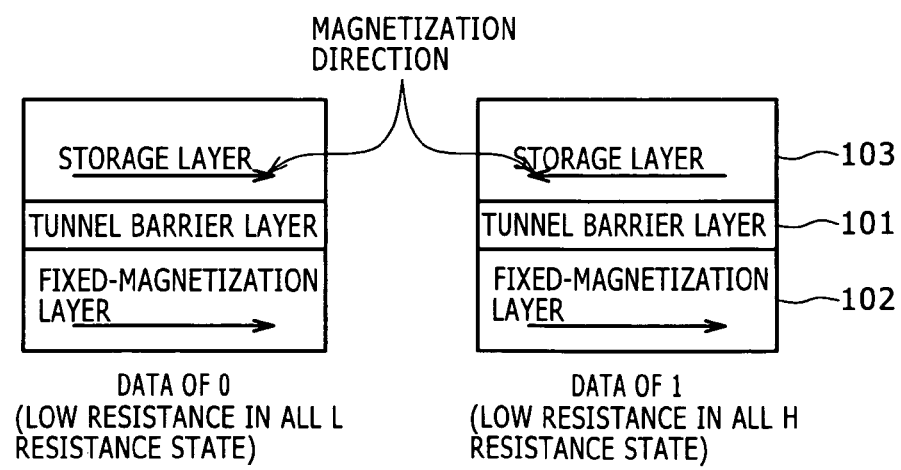
FIGS. 9A and 9B are diagrams each showing a relation between the directions of the magnetization states of storage and fixed-magnetization layers and the value of bit data.

FIG. 9A is a diagram showing a relation between the directions of the magnetization states of the storage layer as well as the fixed-magnetization layer and the 0 value of bit data stored in the storage layer whereas FIG. 9B is a diagram showing a relation between the directions of the magnetization states of the storage layer as well as the fixed-magnetization layer and the 1 value of bit data stored in the storage layer. On the other hand, each of FIGS. 10A and 10B is a diagram showing a relation between the direction of a memory-cell current Icell flowing through the tunnel magnetic resistance element TMR in a write operation and the value of the bit data stored in the tunnel magnetic resistance element TMR as a result of the write operation.

As shown in FIG. 9A, the direction of the magnetization state of the storage layer 103 is the same as the direction of the magnetization state of the fixed-magnetization layer 102. Thus, the tunnel magnetic resistance element TMR is said to be in an L resistance state having a small resistance of the tunnel magnetic resistance element TMR. This L resistance state is typically associated with bit data having the value of 0. As shown in FIG. 9B, on the other hand, the direction of the magnetization state of the storage layer 103 is opposite to the direction of the magnetization state of the fixed-magnetization layer 102, forming an angle of 180 degrees. Thus, the tunnel magnetic resistance element TMR is said to be in an H resistance state having a large resistance of the tunnel magnetic resistance element TMR. This H resistance state is typically associated with bit data having the value of 1.

It is to be noted that the above definition can be reversed. As a matter of fact, the hysteresis characteristic shown in FIG. 6 conforms to the reversed definitions. In order to make the following explanation of operations simple, however, the definitions shown in FIG. 9 are presumed.

Taking the cross-sectional structures shown in FIG. 3 as a prerequisite, the tunnel magnetic resistance element TMR is presumed to have a storage layer 103 on one end connected to the bit line BL and a fixed-magnetization layer 102 on the other end close to the source line SL (or on the other end close to a location connected to the external-magnetic-field generation line HWL). These ends of the tunnel magnetic resistance element TMR are clearly shown in FIGS. 1 and 2. The word 'upper' used in the following description means 'relatively far' from the semiconductor substrate 200 shown in FIG. 3. On the other hand, the word 'lower' means 'relatively close' to the semiconductor substrate 200.

When the memory-cell current Icell flows in a direction from the bit line BL to the source line SL or in a downward direction from the storage layer 103 on the upper side to the fixed-magnetization layer 102 on the lower side as shown in FIG. 10A, a transition is made from the H resistance state to the L resistance side. This transition is referred to as a write0 transition in an operation to store bit data having the value of 0 into the storage layer 102. When the memory-cell current Icell flows in a direction from the source line SL to the bit line BL or in a upward direction from the fixed-magnetization layer 102 on the lower side to the storage layer 103 on the upper side as shown in FIG. 10B, on the other hand, a transition is made from the L resistance state to the H resistance side. This transition is referred to as a write1 transition in an operation to store bit data having the value of 1 into the storage layer 102.

By assuming the definitions described above, the following description explains the write operation to write bit data into a memory cell MC having the parallel common line type as shown in FIGS. 1 and 3 as well as the read operation to read out bit data from such a memory cell MC.

Figure 11:
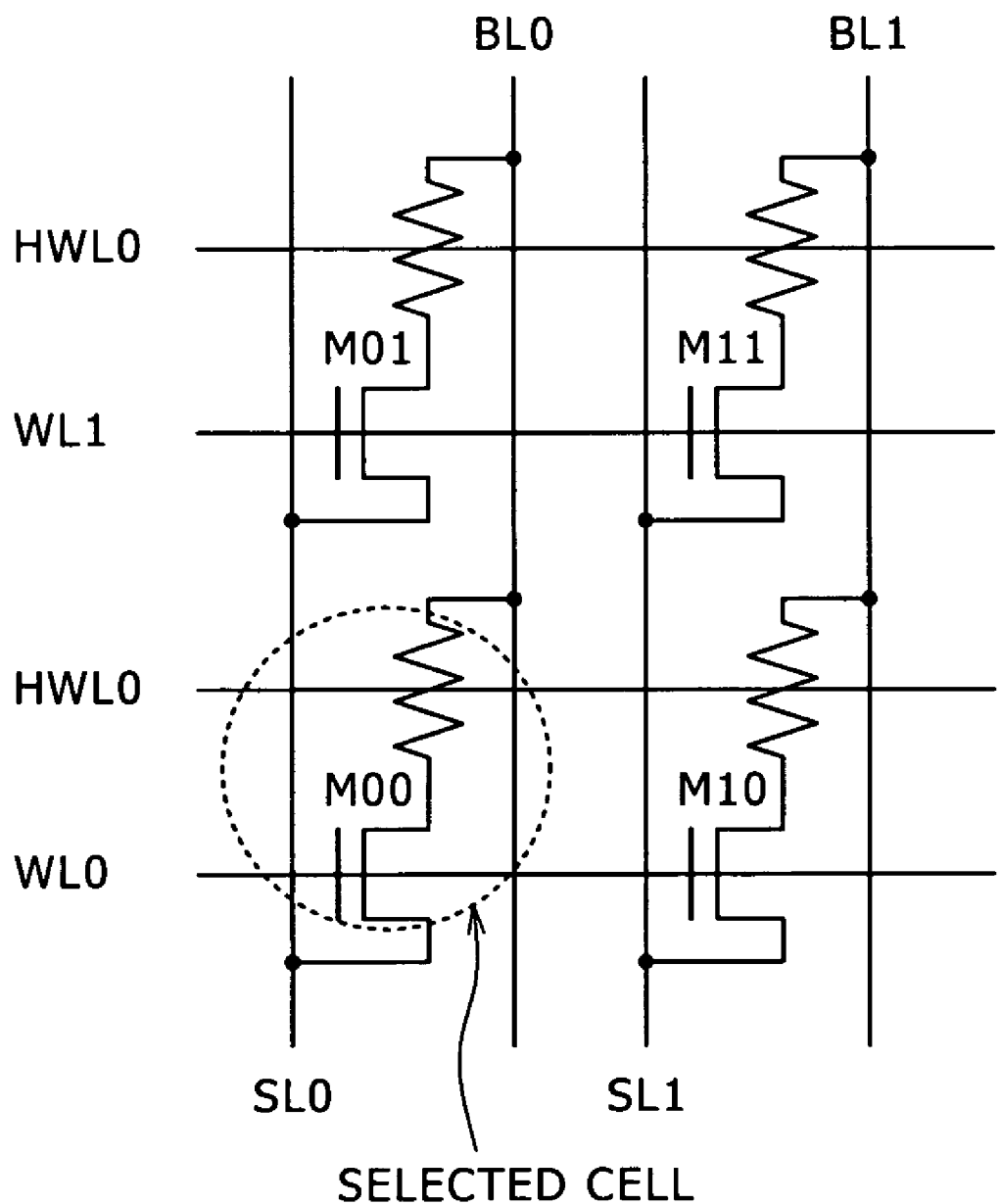
FIG. 11 is an explanatory diagram to be referred to in description of a selected memory cell and unselected memory cells.

A memory cell M00 located at the intersection of a write line WL0 and a bit line BL0 as shown in FIG. 11 is a selected memory cell MC serving as a target of the write and read operations. Each of three other memory cells M01, M10 and M11 located in the vicinity of the memory cell MC (0, 0) is an unselected memory cell MC.

<Data Write Operation>

FIGS. 12A to 12H show timing charts of electric potentials appearing on a variety of control lines in a write operation to store bit data having the value of 0 into the memory cell MC (0, 0) by driving the memory cell MC (0, 0) to make a write0 transition from the H resistance state to the L resistance state. On the other hand, FIGS. 13A to 13H show timing charts of electric potentials appearing on the control lines in a write operation to store bit data having the value of 1 into the memory cell MC (0, 0) by driving the memory cell MC (0, 0) to make a write1 transition from the L resistance state to the H resistance state.

In a standby state prior to a time T1, a word line WL0 shown in FIGS. 12A and 13A, a word line WL1 shown in FIGS. 12B and 13B, a bit line BL0 shown in FIGS. 12C and 13C, a bit line BL1 shown in FIGS. 12D and 13D, a source line SL0 shown in FIGS. 12E and 13E as well as a source line SL1 shown in FIGS. 12F and 13F are all set at an L (low) level representing an electric potential appearing on 0 [V]. In addition, no currents are flowing through an external-magnetic-field generation line HWL0 shown in FIGS. 12G and 13G as well as an external-magnetic-field generation line HWL1 shown in FIGS. 12H and 13H.

In a write0 operation to store bit data having the value of 0 into the memory cell MC (0, 0), the electric potential appearing on the selected write line WL0 is raised from the L level to an H (high) level to set the write line WL0 in an active state at the time T1 as shown in FIG. 12A. Then, the electric potential appearing on the selected bit line BL0 is also raised from the L level to the H (high) level to set the bit line BL0 in an active state at a subsequent time T2 as shown in FIG. 12C. At the times T1 and T2, the electric potentials of an unselected word line WL1 and an unselected bit line BL1 respectively are sustained at the L level as they are as shown in FIGS. 12B and 12D respectively.

By executing the control described above, an access transistor AT employed in the memory cell MC (0, 0) is turned on, causing the memory-cell current Icell to flow from the selected bit line BL0 directly connected to the storage layer 103 on the upper side of the tunnel magnetic resistance element TMR employed in the memory cell MC (0, 0) to the selected source line SL0 indirectly connected through the access transistor AT to the fixed-magnetization layer 102 on the lower side as shown in FIG. 10A. As a result, the direction of the magnetization state of the storage layer 103 becomes the same as that of the fixed-magnetization layer 102 to give an L resistance state representing the stored bit data having the value of 0.

In a write1 operation to store bit data having the value of 1 into the memory cell MC (0, 0), on the other hand, the electric potential appearing on the selected write line WL0 is also raised from the L level to the H (high) level to set the write line WL0 in an active state at the time T1 as shown in FIG. 13A. Then, at the subsequent time 2, a write voltage is applied between the selected bit line BL0 and the selected source line SL0 as is the case of the write0 operation explained by referring to FIG. 12. In the case of the write1 operation, however, at the subsequent time T2, the electric potential appearing on the selected source line SL0 is raised from the L level to the H (high) level as shown in FIG. 13E whereas the electric potential appearing on the selected bit line BL0 is sustained as it is. This is because, in the circuit configuration shown in FIG. 8 for example, the logic of the input data DIN in the write1 operation is the inverted logic of the input data DIN in the write0 operation whereas the logic of the inverted input data/DIN in the write1 operation is the inverted logic of the inverted input data/DIN in the write0 operation.

By executing the control described above in the write1 operation, a write voltage is applied to the tunnel magnetic resistance element TMR employed in the memory cell MC (0, 0) in an upward direction opposite to the downward direction of the write0 direction. Also in the case of the write1 operation, the access transistor AT employed in the memory cell MC (0, 0) is turned on. However, the turned-on access transistor AT causes the memory-cell current Icell to flow from the selected source line SL0 indirectly connected through the access transistor AT to the storage layer 103 on the lower side of the tunnel magnetic resistance element TMR to the selected bit line BL0 directly connected to the storage layer 103 on the upper side as shown in FIG. 10B. As a result, the direction of the magnetization state of the storage layer 103 becomes opposite to that of the fixed-magnetization layer 102 to give an H resistance state representing the stored bit data having the value of 1.

The unselected memory cells M01, M10 and M11 may not receive a write voltage applied between the bit and source lines or may not have their word lines put in an active state. As an alternative, the unselected memory cells M01, M10 and M11 may neither receive a write voltage applied between the bit and source lines nor have their word lines put in an active state. As a matter of fact, as shown in the timing charts of FIGS. 12 and 13, the unselected memory cell M10 does not receive a write voltage applied between the bit line BL1 and the source line BL1, the unselected memory cell M01 does not have the word line WL1 thereof put in an active state and the unselected memory cell M11 neither receives a write voltage applied between t the bit line BL1 and the source line BL1 nor has the word line WL1 thereof put in an active state. Thus, since the memory-cell current Icell does not flow through each of the unselected memory cells M01, M10 and M11, no write operation is carried out on the unselected memory cells.

In the write0 and write1 operations, a period long enough for inverting the direction of the magnetization state of the storage layer 103 lapses since the time T2. At a time T3 at the end of the period, the bit line BL0 is restored to the inactive state in the write0 operation or the source line SL0 is restored to the inactive state in the write0 operation. Then, at a subsequent time T4, the write line WL0 is restored to the inactive state in both the write0 and write1 operations.

In the write0 and write1 operations described above, currents are not flowed at all to both the external-magnetic-field generation line HWL0 and the external-magnetic-field generation line HWL1 during the period T1 to T4. However, a current may be flowed to the external-magnetic-field generation line HWL0 in a direction generating an external magnetic field in a direction strengthening the effect of the memory-cell current Icell, that is, in a direction bolstering the write operation. In this case, the direction of the current for generating an external magnetic field can be determined in accordance with the logic of the input data DIN to be stored in the memory cell MC.

In addition, the order of raising the electric potentials of the write line WL0 and the bit line BL0 can be reversed or the electric potentials can be raised at the same time in the write0 operation. By the same token, the order of raising the electric potentials of the write line WL0 and the source line SL0 can be reversed or the electric potentials can be raised at the same time in the write1 operation. In the same way, the order of pulling down the electric potentials of the write line WL0 and the bit line BL0 can be reversed or the electric potentials can be pulled down at the same time in the write0 operation. Likewise, the order of pulling down the electric potentials of the write line WL0 and the source line SL0 can be reversed or the electric potentials can be raised at the same time in the write1 operation.

The voltage applied to the bit line BL0 in the write0 operation or the source line SL0 in the write1 operation is equal to the voltage of the power supply. In this case, for example, the applied voltage is 1.8 [V]. However, the applied voltage can also be lower or higher than the power-supply voltage of 1.8 [V].

<Data Read Operation>

Much like FIGS. 12A to 12H and 13A to 13H, FIGS. 14A to 14H show timing charts of electric potentials appearing on a variety of control lines in a read operation to read out bit data from the memory cell MC (0, 0) in the write0 mode. In addition, FIG. 14I shows the waveforms of the input voltage VIN and the output voltage VOUT of the differential sense amplifier DAMP employed in the bit-line sense amplifier 7B shown in FIG. 8.

Much like the write0 operation described above, in the read operation carried out in the write0 mode, the electric potential appearing on the selected write line WL0 is raised from the L level to an H (high) level to set the write line WL0 in an active state at the time T1 as shown in FIG. 14A. Then, the electric potential appearing on the selected bit line BL0 is also raised from 0 [V] to a fixed voltage higher than 0 [V] at a time T6 as shown in FIG. 12C. However, the electric potential appearing on the source line SL0 is sustained as it is. The selected bit line BL0 is raised from 0 [V] to the fixed voltage by turning on the TG 8B (M) at the time T6 in order to connect the selected bit line BL0 to the global bit line GBL sustained at the bit-line voltage VBL as shown in FIG. 8. The selected memory cell M00 shown in FIG. 11 corresponds to M=0. Since the TG 8S (M) has been turned on earlier to connect the source line SL0 to the global source line GSL as shown in FIG. 8, the memory-cell current Icell flows from the bit line BL0 to the source line SL0 through the memory cell M00 as shown in FIG. 8 in the so-called write0 mode described before. For M=0, the source line SL (M), the bit line BL (M) and the memory cell MC (M, M), which are shown in FIG. 8, are the source line SL0, the bit line BL0 and memory cell M00 respectively.

The electric potential actually appearing on the global bit line GBL is determined by balance among the power of the negative feedback amplifier 90 making an attempt to sustain the electric potential at the bit-line voltage VBL, the pull-up power of the PMOS transistor 75P and an electric-potential drop caused by the flowing memory-cell current Icell as an electric-potential drop through the PMOS transistor 75P and the NMOS transistor 75N which are shown in FIG. 8. In actuality, the electric potential appearing on the global bit line GBL is lower than the bit-line voltage VBL. It is to be noted, however, that the magnitude of the memory-cell current Icell is dependent on the resistance of the tunnel magnetic resistance element TMR which has different resistances according to the logic (or the value) of bit data stored in the tunnel magnetic resistance element TMR. Thus, the electric-potential drop caused by the flowing memory-cell current Icell is dependent on the logic of bit data stored in the tunnel magnetic resistance element TMR.

The waveforms shown in FIG. 14I before a time T7 are the waveforms of the input voltage VIN. Stored bit data having the value of 0 gives a small resistance to the tunnel magnetic resistance element TMR and, hence, results in a large electric-potential drop in comparison with bit data having the value of 1. Thus, after the time T6, the input voltage VIN for stored bit data having the value of 0 decreases by a large electric-potential drop in comparison with bit data having the value of 1 as shown in FIG. 14I. The waveforms shown in FIG. 14I after the time T7 are the waveforms of the output voltage VOUT output by the differential sense amplifier DAMP as a result of sensing the input voltage VIN by making use of the reference voltage VREF as a reference voltage. As shown in the figure, after the time T7, the output voltage VOUT for stored bit data having the value of 1 becomes much higher than the reference voltage VREF whereas the output voltage VOUT for stored bit data having the value of 0 becomes much lower than the reference voltage VREF. The difference between the output voltage VOUT for stored bit data having the value of 1 and the output voltage VOUT for stored bit data having the value of 0 is typically about equal to the voltage of the power supply.

Let us assume for example that the bit-line voltage VBL is 0.1 [V], the on resistance of the access transistor AT is 1 [kΩ], the resistance of the memory cell MC in the L resistance state is 2 [kΩ] and the resistance of the memory cell MC in the H resistance state is 4 [kΩ]. In this case, the memory-cell current Icell flowing through the memory cell MC has a magnitude of 33 [μA] in the L resistance state and 20 [μA] in the H resistance state. This difference in memory-cell current Icell makes it possible to determine whether the memory cell MC is in the L or H resistance state representing stored bit data having the value of 0 or 1 respectively.

In this embodiment, at a time T5 prior to the time T6, the electric potential appearing on the external-magnetic-field generation line HWL0 is raised from the L level to an H level flowing a fixed external magnetic field current as shown in FIG. 14G so as to flow the fixed current through the external-magnetic-field generation line HWL0. The fixed external magnetic field current generates an external magnetic field for preventing an inadvertent write operation to be described later from being carried out unintentionally in the read operation. The external magnetic field becomes stabile prior to the time T6. At the time T6, the read operation described above is started by raising the electric potential appearing on the bit line BL0 from the L level to the level of the bit-line voltage VBL as shown in FIG. 14C.

As will be described later in detail, in the read operation described above, an inadvertent write operation can be prevented from being carried out unintentionally on the memory cell MC (0, 0) and the unselected memory cells M01, M10 and M11. The direction of the external magnetic field current flowing through the external-magnetic-field generation line HWL0 will be described later.

On the other hand, during a read operation, the unselected bit line BL1 connected to the unselected memory cells M10 and M11 and the unselected source line SL1 also connected to the unselected memory cells M10 and M11 are sustained at 0 [V] as they are as shown in FIGS. 14D and 14F respectively. In addition, no external magnetic field current is flowed through the unselected external-magnetic-field generation line HWL1 associated with the unselected memory cells M01 and M11 as shown in FIG. 14H.

It is to be noted that a read operation can also be carried out on a memory cell MC in a write1 mode in which the memory-cell current Icell flows through the memory cell MC in the same direction as the write1 operation. In the read operation of the write1 mode, the bit line BL is sustained at 0 [V] whereas the source line SL0 is raised to a fixed bit-line voltage VBL higher than 0 [V]. A technique to sustain the bit line BL at 0 [V] and to raise the source line SL0 to a fixed bit-line voltage VBL higher than 0 [V] will be described later. It is also worth noting that FIG. 8 shows control circuits for a read operation carried out in the write0 mode and FIG. 14 shows timing charts of control signals generated a read operation carried out in the write0 mode. Thus, since the direction of the memory-cell current Icell in the write1 mode is opposite to that of the memory-cell current Icell shown in FIG. 14C, the direction of the external magnetic field current flowing through the external-magnetic-field generation line HWL0 must be reversed in the write1 mode to one opposite to that of the current in the write0 mode shown in FIG. 14G. A technique to reverse the direction of the external magnetic field current flowing through the external-magnetic-field generation line HWL0 in the write1 mode to one opposite to that of the current in the write0 mode shown in FIG. 14G can be implemented with ease.

The semiconductor memory device according to the embodiment and the data read method thereof are characterized in that an external magnetic field parallel to the direction of the magnetization state of the storage layer employed in the semiconductor memory device is generated in the read operation as described above. It is desirable to further provide a configuration in which the direction of the generated magnetic field in a read operation can be reversed in accordance with the direction of the memory-cell current Icell flowing-through the memory cell MC in the read operation.

A technique to sustain the bit line BL at 0 [V] and to raise the source line SL0 to a fixed bit-line voltage VBL higher than 0 [V] is described as follows. As described above, FIG. 8 shows control circuits for a read operation carried out in the write0 mode. In order to reverse the direction of the memory-cell current Icell flowing through the memory cell MC in the read operation carried out in the write0 mode, that is, in order to carry out the read operation in the write1 mode, the connection of the source line SL (M) to the source-line read driver 7S and the connection of the bit line BL (M) to the bit-line sense amplifier 7B, which are shown in FIG. 8, must be interchanged. That is to say, the source line SL (M) must be connected to the bit-line sense amplifier 7B whereas the bit line BL (M) must be connected to the source-line read driver 7S.

In order to connect the source line SL (M) to the bit-line sense amplifier 7B and connect the bit line BL (M) to the source-line read driver 7S, the function of the column select switch circuit 8 must be changed so that the TG 8S (M) connects the source line SL (M) to the bit-line sense amplifier 7B through the global bit line GBL whereas the TG 8B (M) connects the bit line BL (M) to the source-line read driver 7S through the global source line GSL. This technique can be implemented by adding 2 (N+1) more new TGs in the configuration of the column select switch circuit 8 to give a new configuration. In this new configuration, the 2 (N+1) existing TGs are used for connecting the source line SL (M) to the source-line read driver 7S through the global source line GSL and the bit line BL (M) to the bit-line sense amplifier 7B through the global bit line GBL as shown in FIG. 8 whereas the 2 (N+1) new TGs are used for connecting the source line SL (M) to the bit-line sense amplifier 7B through the global bit line GBL and the bit line BL (M) to the source-line read driver 7S through the global source line GSL. In this new configuration, the 2 (N+1) existing TGs are selected and used in a read operation carried out in the write0 mode whereas the 2 (N+1) new TGs are selected and used in a read operation carried out in the write1 mode.

Next, effects of applying a generated external magnetic field to a memory cell MC in a read operation are explained. The explanation begins with a read error rate which is a rate at which the direction of the magnetization state of the storage layer is inadvertently inverted in an inadvertent write operation carried out unintentionally in a read operation. First of all, the effects of the memory-cell current Icell and the external magnetic field on the inversion of the direction of magnetization in an inadvertent write operation carried out unintentionally in a deliberate read operation are thought about. FIGS. 15 to 17 are figures to be referred to in the following description of an inadvertent write operation carried out unintentionally in a deliberate read operation.

FIG. 15A is a diagram showing the state of the tunnel magnetic resistance element TMR employed in the selected memory cell MC (0, 0) through which a memory-cell current Icell is flowing in an H resistance state of already storing bit data having the value of 1. FIG. 15B is a diagram showing the state of the tunnel magnetic resistance element TMR employed in the selected memory cell MC (0, 0) through which a memory-cell current Icell is flowing in an L resistance state of already storing bit data having the value of 0. FIG. 15C is a diagram showing the state of the tunnel magnetic resistance element TMR employed in the unselected memory cell MC (1, 0) through which a memory-cell current Icell is not flowing in an H resistance state of already storing bit data having the value of 1. FIG. 15D is a diagram showing the state of the tunnel magnetic resistance element TMR employed in the unselected memory cell MC (1, 0) through which a memory-cell current Icell is not flowing in an L resistance state of already storing bit data having the value of 0.

Figure 16A:
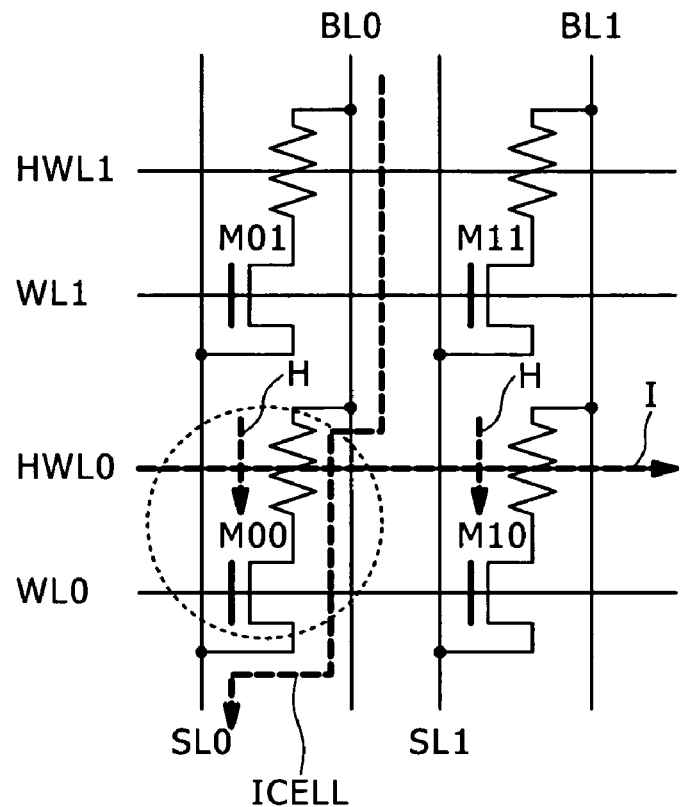
FIGS. 16A and 16B are explanatory diagrams to be referred to in description of an inadvertent state transition caused by an inadvertent write operation carried out unintentionally due to application of an external magnetic field to an unselected memory cell in a read operation performed intentionally on a selected memory cell.
Figure 16B:
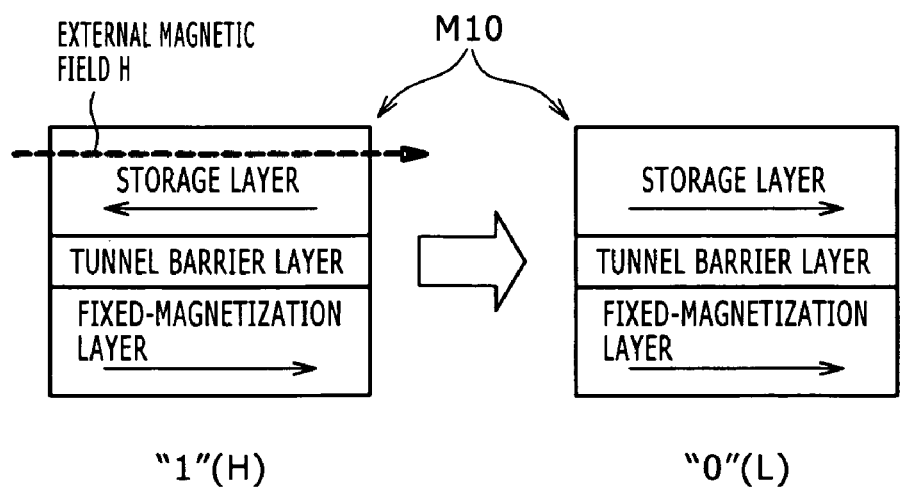
Figure 17:
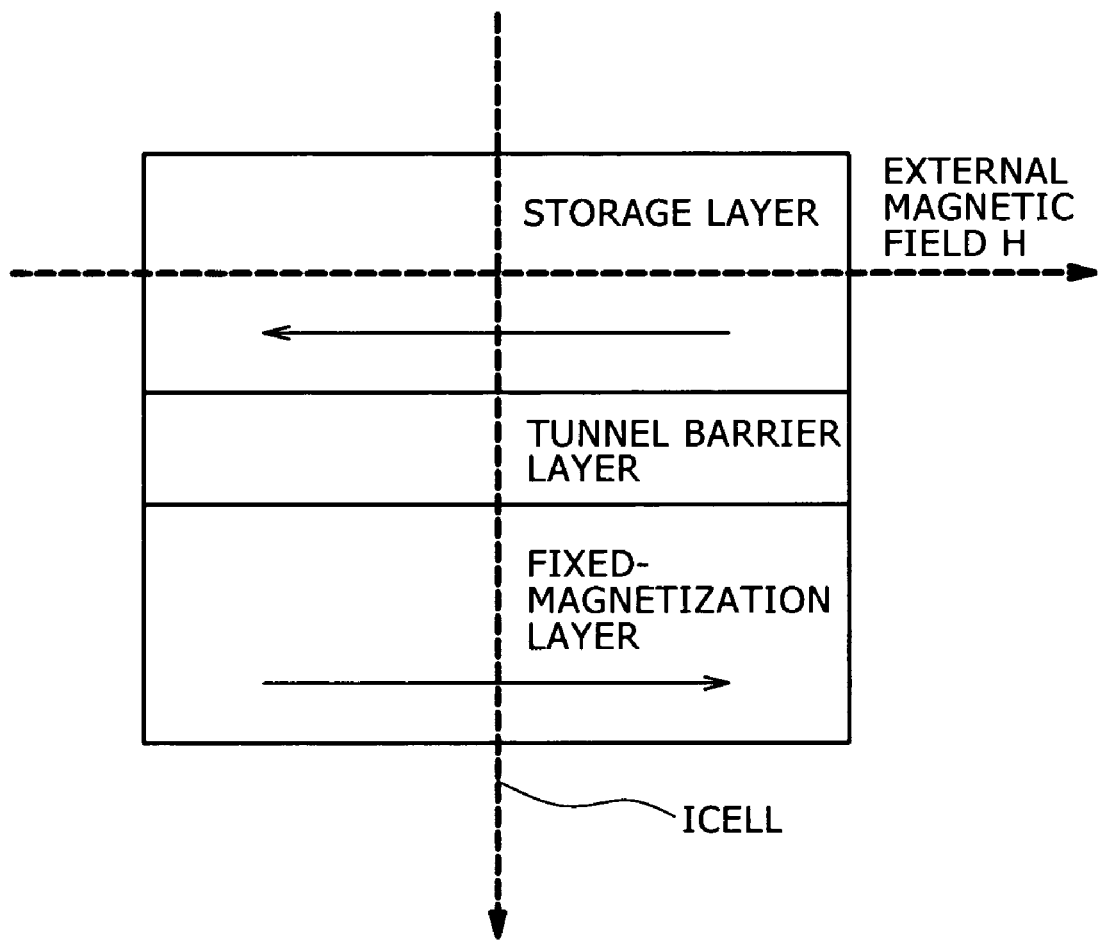
FIG. 17 is a diagram showing a read operation in which the directions of an external magnetic field, the magnetization state and a memory-cell current may cause the direction of the magnetization state of the storage layer be inverted with ease in the read operation.

FIG. 16A is a diagram showing the layout of a memory array 1 including the selected memory cell MC (0, 0) and the unselected memory cell MC (1, 0), which are mentioned in the explanation of FIG. 15. FIG. 16B is a diagram showing a model of a state transition made by the unselected memory cell MC (1, 0) from an H resistance state of having bit data with the value of 1 to an L resistance state of having bit data with the value of 0.

A transition shown in FIG. 16B as a state transition carried out by the memory cell MC (1, 0) from an H resistance state of having bit data with the value of 1 as evidenced by the opposite directions of the magnetizations of the storage and fixed-magnetization layers of the memory cell MC (1, 0) to an L resistance state of having bit data with the value of 0 as evidenced by the same directions of the magnetizations of the storage and fixed-magnetization layers is caused by an external magnetic field H. This state transition is caused by an inadvertent write operation carried out unintentionally due to application of the external magnetic field H also to the unselected memory cell MC (1, 0) in a read operation performed on the selected memory cell MC (0, 0). This is because the unselected memory cell MC (1, 0) and the selected memory cell MC (0, 0) are connected to the same external-magnetic-field generation line WL0.

The same transition as that shown in the figure can also be carried out in the memory cell MC (0, 0) by a memory-cell current Icell flowing in the downward direction from the upper-side storage layer connected to the bit line BL0 shown in FIG. 16A to the lower-side fixed-magnetization layer connected to the source line SL0 also shown in FIG. 16A in an inadvertent write operation carried out unintentionally in a read operation performed in the write0 mode without the application of an external magnetic field H provided that the memory-cell current Icell is sufficiently large. In either case, the direction of the magnetization state of the storage layer is inverted to the same direction as the fixed-magnetization layer. If the direction of the magnetization state of the storage layer is the same as that of the fixed-magnetization layer in the memory cell MC (0, 0), on the other hand, a memory-cell current Icell flowing in an upward direction to the upper-side storage layer connected to the bit line BL0 from the lower-side fixed-magnetization layer connected to the source line SL0 will invert the direction of the magnetization state of the storage layer to a direction opposite to that of the fixed-magnetization layer in an inadvertent write operation carried out unintentionally in a read operation performed in the write1 mode without the application of an external magnetic field H.

With the application of an external magnetic field H, FIG. 15A is a diagram showing an operation to read out data from the tunnel magnetic resistance element TMR employed in the selected memory cell MC (0, 0) in a state of already storing bit data having the value of 1 by flowing a memory-cell current Icell through the tunnel magnetic resistance element TMR and applying an external magnetic field H to the tunnel magnetic resistance element TMR. On the other hand, FIG. 15B is a diagram showing an operation to read out data from the tunnel magnetic resistance element TMR employed in the selected memory cell MC (0, 0) in a state of already storing bit data having the value of 0 by flowing a memory-cell current Icell flowing through the tunnel magnetic resistance element TMR and applying an external magnetic field H to the tunnel magnetic resistance element TMR.

If the direction of the magnetization state of the storage layer is opposite to that of the fixed-magnetization layer prior to the read operation, indicating that bit data having the value of 1 has already been stored in the storage layer, a memory-cell current Icell flowing in an upward direction to the upper-side storage layer connected to the bit line BL1 from the lower-side fixed-magnetization layer connected to the source line SL1 in the read operation carried out in the write1 mode will not invert the direction of the magnetization state of the storage layer to the same direction as the fixed-magnetization layer. By the same token, if the direction of the magnetization state of the storage layer is the same as that of the fixed-magnetization layer prior to the read operation, indicating that bit data having the value of 0 has already been stored in the storage layer, on the other hand, a memory-cell current Icell flowing in a downward direction from the upper-side storage layer connected to the bit line BL1 to the lower-side fixed-magnetization layer connected to the source line SL1 in the read operation carried out in the write0 mode will not invert the direction of the magnetization state of the storage layer to a direction opposite to that of the fixed-magnetization layer.

As shown in FIG. 16A, a force generated only by an external magnetic field H as a force for inverting the direction of the magnetization state of the storage layer of the unselected memory cell MC (1, 0) is applied to the memory cell MC (1, 0). In this case, the direction of the magnetization state of the storage layer can be inverted to the same direction as the external magnetic field H as shown on the right-hand side of FIG. 16B.

As shown in FIG. 15D, a force generated by an external magnetic field H as a force for inverting the direction of the magnetization state of the storage layer of the unselected memory cell MC (1, 0) is applied to the memory cell MC (1, 0). In this case, however, the direction of the magnetization state of the storage layer can be inverted to the same direction as the external magnetic field H but to a direction opposite to the direction of the fixed-magnetization layer. If the direction of the external magnetic field H is the same as the direction of the magnetization state of the storage layer as also shown in FIG. 15C, on the other hand, the direction of the magnetization state of the storage layer is not inverted.

As described above, the external magnetic field H can be applied to a memory cell MC in one of the 4 possible cases shown in FIG. 15. The 2 cases shown in the 2 upper diagrams respectively are a case of a selected memory cell M00 having bit data with the value of 1 and a case of a selected memory cell M00 having bit data with the value of 0. On the other hands, the 2 cases shown in the 2 lower diagrams respectively are a case of an unselected memory cell M10 having bit data with the value of 1 and a case of an unselected memory cell M10 having bit data with the value of 0.

The following description explains cases in which a memory-cell current Icell flows through the memory cell MC and an external magnetic field H is applied to the memory cell MC in more detail.

FIG. 17 is a diagram showing the same case as FIG. 15A except that the direction of the external magnetic field H is opposite to that shown in FIG. 15A.

In the state shown in FIG. 17, much like the state shown in FIG. 15A, the direction of the magnetization state of the storage layer employed in the memory cell MC is also opposite to the direction of the magnetization state of the fixed-magnetization layer employed in the memory cell MC. In addition, much like the state shown in FIG. 15A, the memory-cell current Icell is flowing in the downward direction from the upper-side storage layer connected to the bit line BL0 shown in FIG. 16A to the lower-side fixed-magnetization layer connected to the source line SL0 also shown in FIG. 16A. Thus, the direction of the external magnetic field H is opposite to the direction of the magnetization state of the storage layer. Let this case be referred to as a fifth case.

Let us keep in mind that, for a reason to be described later, it is desirable to apply an external magnetic field H in the direction shown in FIG. 15A if the memory-cell current Icell is flowing in the downward direction from the upper-side storage layer to the lower-side fixed-magnetization layer. Thus, the direction shown in FIG. 17 as the direction of the external magnetic field H is not desirable for the embodiment. FIG. 17 is a diagram showing the fifth case applying an external magnetic field H with a direction opposite to the direction of the magnetization state of the storage layer as a model case of an inadvertent write operation unintentionally causing inversion of the direction of the magnetization state of the storage layer. The inadvertent write operation is defined as a write operation which is carried out unintentionally during a deliberate read operation so as to inadvertently cause inversion of the direction of the magnetization state of the storage layer. The inadvertent write operation unintentionally causing inversion of the direction of the magnetization state of the storage layer is shown in none of the figures.

As described above, FIG. 15A is a diagram showing a read operation carried out in the write0 mode. This read operation never unintentionally causes an inadvertent write0 operation due to the downward direction of the memory-cell current Icell because the direction of the external magnetic field H is the same as that of the magnetization of the storage layer so that the direction of the magnetization is hardly inverted. On the other hand, FIG. 17 is also a diagram showing a read operation carried out in the write0 mode. However, this read operation may unintentionally cause an inadvertent write0 operation due to the downward direction of the memory-cell current Icell because the direction of the external magnetic field H is opposite to that of the magnetization of the storage layer so that the direction of the magnetization may possibly be inverted.

To put it in detail, in the fifth case shown in FIG. 17, the direction of the memory-cell current Icell is the direction of the write0 operation shown in FIG. 10A. The direction of the memory-cell current Icell generates a magnetic force that makes an attempt to invert the direction of the magnetization state of the storage layer to the same direction as that of the fixed-magnetization layer.

By the way, as explained earlier by referring to FIG. 16B, the external magnetic field H alone may help the storage layer invert the direction of the magnetization thereof. Thus, the read operation shown in FIG. 17 may cause a state transition shown in FIG. 16B in the so-called inadvertent write operation.

Thus, in order to prevent such an inadvertent write operation from unintentionally occurring in a read operation carried out by flowing a memory-cell current Icell and applying an external magnetic field H, it is necessary to set the magnitudes of the memory-cell current Icell and the external magnetic field H at sufficiently small values in comparison with those used in the write operation.

Nevertheless, the larger the memory-cell current Icell, the higher the precision of the read operation. Thus, the memory-cell current Icell with an optimum magnitude is desirable. By the same token, in the case shown in FIG. 15A, the external magnetic field H with a large intensity is required to better prevent the direction of magnetization from being inverted inadvertently. In the case shown in FIG. 17 as a case to be described below, on the other hand, the external magnetic field H with a small intensity is required to prevent the field H from helping the memory-cell current Icell invert the direction of magnetization in an inadvertent write operation. Thus, the external magnetic field H with an optimum intensity is also desirable.

Even if each of the magnitudes of the memory-cell current Icell and the external magnetic field H is set at a sufficiently small value, however, in comparison with a state with no memory-cell current Icell flowing and no external magnetic field H applied, the memory-cell current Icell and the external magnetic field H still work to invert the direction of the magnetization state of the storage layer provided that the direction of the memory-cell current Icell is a direction making an attempt to invert the direction of the magnetization state of the storage layer and the direction of the external magnetic field H is opposite to the direction of the magnetization as shown in FIG. 17.

In the read operation shown in FIG. 17, the memory-cell current Icell flows in the direction of the write0 mode making an attempt to invert the direction of the magnetization state of the storage layer to the same direction as that of the fixed-magnetization layer in an inadvertent write0 operation which may store bit data having the value of 0 and the external magnetic field H is also oriented in a direction making an attempt to invert the direction of the magnetization state of the storage layer. The inadvertent write operation unintentionally inverts the direction of the magnetization state of the storage layer at a limited probability referred to as a magnetization inversion probability Perr which is expressed by Eq. (1) as follows.

Equation 1

$$Perr = A \exp\{-(KuV/kT)(1-I/Ico)(1-H/Hco)^2\} \quad (1)$$

In Eq. (1), notation Ku denotes a magnetic anisotropy energy, notation V denotes a volume, notation k is the Boltzmann constant, notation T denotes a temperature and notation A denotes a constant of proportion. Notation Ico denotes a current required to completely invert the direction of the magnetization in a write operation to invert the magnetization-state direction by merely flowing the current. That is to say, notation Ico is the magnitude of a write current. Notation Hco denotes an external magnetic field required to completely invert the direction of the magnetization in a write operation to invert the magnetization-state direction by merely applying the field. That is to say, notation Hco is the intensity of a write external magnetic field.

Eq. (1) indicates that, the larger the memory-cell current Icell flowing through the memory cell MC in a read operation, the higher the magnetization inversion probability Perr at which the magnetization of the direction of the storage layer is inverted unintentionally in an inadvertent write operation carried out mistakenly in the read operation even though the memory-cell current Icell flowing through a memory cell MC in a read operation is normally small in comparison with the a memory-cell write current Ico flowing through the memory cell MC in a write operation. In addition, the larger the external magnetic field H applied to a memory cell MC in a read operation, the higher the magnetization inversion probability Perr even though the external magnetic field H applied to a memory cell MC in a read operation is generally small in comparison with an external magnetic field Hco applied to the memory cell MC in a write operation.

On top of that, Eq. (1) also indicates that the application of an external magnetic field H to a memory cell MC as shown in FIG. 17 also increases the magnetization inversion probability Perr to a value larger than that of a case in which the external magnetic field H is equal to 0. If the external magnetic field H is applied to the memory cell MC in the right direction as shown in FIG. 15A, however, the magnetization inversion probability Perr decreases due to the fact that the effect of the external magnetic field H reduces the effect of the memory-cell current Icell.

To put it in detail, if the external magnetic field H is applied to the memory cell MC in the same direction as that of the magnetization of the storage layer as shown in FIG. 15A, however, the term of the external magnetic field H has a sign opposite to that of the external magnetic field H in Eq. (1), decreasing the magnetization inversion probability Perr due to the fact that the effect of the external magnetic field H reduces the effect of the memory-cell current Icell as shown in Eq. (2) given below.

Equation 2

$$Perr = A \exp\{-(KuV/kT)(1-I/Ico)(1+H/Hco)^2\} \quad (2)$$

As shown in Eq. (2) which is applicable to the case shown in FIG. 15A, the H term (H/Hco) having a negative sign in Eq.

(1) now has the sign inverted to a positive one. By applying the external magnetic field H to the memory cell MC in the same direction as that of the magnetization of the storage layer as shown in FIG. 15A, the magnetization inversion probability Perr according to Eq. (2) has a small value in comparison with a case in which the external magnetic field H is equal to 0. That is to say, if the external magnetic field H is applied to a memory cell MC in a direction opposite to the direction in which a memory-cell current Icell is trying to inadvertently orient the magnetization of the storage layer employed in the memory cell MC in a read operation by flowing the memory-cell current Icell through the memory cell MC, it becomes more difficult to invert the magnetization-state direction. Thus, the magnetization inversion probability Perr of the storage layer through which the memory-cell current Icell is flowing is small in comparison with a read operation without applying an external magnetic field H. In other words, the probability that an inadvertent write operation unintentionally inverts the direction of the magnetization state of the storage layer in a read operation is smaller than that of a read operation applying no external magnetic field H.

As described above, the larger the magnitude of the memory-cell current Icell, the higher the precision of the read operation. Thus, an optimum magnitude of the memory-cell current Icell is a largest possible value that does not give an excessively large magnetization inversion probability Perr according to both Eqs. (1) and (2).

As for the external magnetic field H, in accordance with Eq. (1), the larger the intensity, the larger the magnetization inversion probability Perr. In accordance with Eq. (2), on the other hand, the smaller the intensity, the larger the magnetization inversion probability Perr. Thus, an optimum intensity is an intensity which is small enough so as to give a low magnetization inversion probability Perr according to Eq. (1) but large enough so as to give a low magnetization inversion probability Perr according to Eq. (2).

Figure 18:
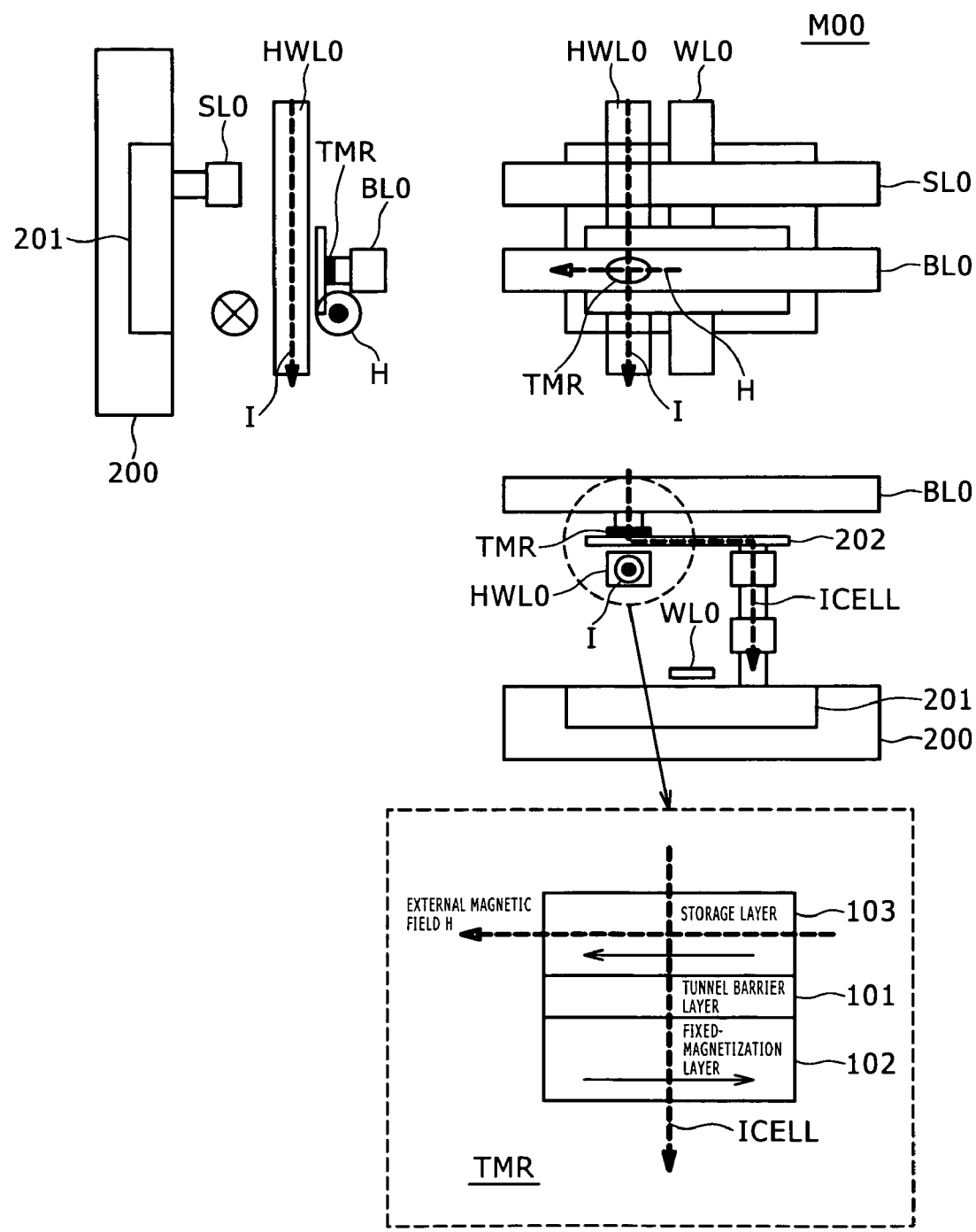
FIG. 18 is a plurality of diagrams each showing a cross section of the structure of a memory cell to which an external magnetic field is applied and a memory-cell current is flowed.

FIG. 18 is a plurality of cross-sectional diagrams obtained by rotating the cross-sectional diagrams, which are shown in FIG. 3 as diagrams for the selected memory cell MC (0, 0), by 90 degrees. FIG. 18 deliberately shows an external magnetic field H, a external magnetic field generation current I flowing through the external-magnetic-field generation line HWL to generate the external magnetic field H and a memory-cell current Icell. The directions of the external magnetic field H, the external magnetic field generation current I and the memory-cell current Icell are the same as those shown in the equivalent circuit of FIG. 16A.

As shown in partially enlarged portions in FIG. 18, in a read operation shown in FIG. 15A to read out bit data from the memory cell MC (0, 0) having the storage layer 103 thereof magnetized in a direction opposite to the direction the magnetization of its fixed-magnetization layer 102 to represent bit data having the value of 1, the memory-cell current Icell is flowing in a direction from the bit line BL0 to the source line SL0. The direction of the memory-cell current Icell is a direction that may unintentionally cause an inadvertent write operation to store bit data having the value of 0 in the memory cell MC (0, 0) by inverting the direction of the magnetization state of the storage layer 103 to the direction of the memory-cell current Icell. At the same time, however, the external magnetic field generation current I is flowing through the external-magnetic-field generation line HWL0 in a direction shown in FIG. 18 so as to generate the external magnetic field H in the same direction as the magnetization of the storage layer 103, that is, in a direction opposite to the direction of the magnetization state of the fixed-magnetization layer 102.

Thus, in the read operation described above, since the direction of the external magnetic field H is the same as the direction of the magnetization state of the storage layer 103, the external magnetic field H asserts a force preventing the direction of the magnetization state of the storage layer 103 from being inverted by the memory-cell current Icell, that is, preventing the inadvertent write operation from being unintentionally carried out. Thus, the magnetization inversion probability Perr representing the magnetization-state direction inversion probability in accordance with Eq. (2) can be made small in comparison with a read operation without applying an external magnetic field H.

In a read operation shown in FIG. 15B to read out bit data from the memory cell MC (0, 0) having the storage layer 103 thereof already magnetized in same direction as the direction of the magnetization state of its fixed-magnetization layer 102 to represent bit data having the value of 0 from the beginning, on the other hand, the direction of the memory-cell current Icell is a direction that does not invert the direction of the magnetization state of the storage layer 103 in an inadvertent write operation. At the same time, however, the external magnetic field generation current I is flowing through the external-magnetic-field generation line HWL0 to generate the external magnetic field H in a direction opposite to the direction of the magnetization state of the storage layer 103, that is, in a direction to invert the magnetization-state direction. Thus, in the read operation shown in FIG. 15B, since the direction of the external magnetic field H is opposite to the effect of the memory-cell current Icell, the external magnetic field H hardly inverts the direction of the magnetization state of the storage layer 103 as the memory-cell current Icell hardly inverts the direction of the magnetization state of the storage layer 103 in the read operation shown in FIG. 15A. In the state shown in FIG. 15C, the external magnetic field generation current I is flowing through the external-magnetic-field generation line HWL0 to generate the external magnetic field H in the same direction as the magnetization of the storage layer 103 and, in addition, the memory-cell current Icell is not flowing. Thus, the value of the bit data already stored in the memory cell MC (1, 0) is hardly changed and, as a result, there is not a problem of an inadvertent write operation. In the state shown in FIG. 15D, the external magnetic field generation current I is flowing through the external-magnetic-field generation line HWL0 to generate the external magnetic field H in a direction opposite to the direction of the magnetization state of the storage layer 103, that is, to reverse the magnetization-state direction. Since the memory-cell current Icell is not flowing to resist the reversal of the direction of the magnetization state of the storage layer 103, an external magnetic field H with a large intensity may reverse the direction of the magnetization state of the storage layer 103.

What is described above is summarized as follows.

When an external magnetic field H is applied to a selected memory cell MC (0, 0) and an unselected memory cell MC (1, 0) in a read operation carried out on the memory cell MC (0, 0), the existence/nonexistence of a memory-cell current Icell and the relations between the direction of the magnetization state of the storage layer 103 and the direction of the external magnetic field H can be classified into the following 4 cases:

(1): The memory-cell current Icell is flowing through the memory cell MC and the memory cell MC is in an H condition (2): The memory-cell current Icell is flowing through the memory cell MC and the memory cell MC is in an L condition (3): The memory-cell current Icell is not flowing through the memory cell MC and the memory cell MC is in an H condition (4): The memory-cell current Icell is not flowing through the memory cell MC and the memory cell MC is in an L condition. In the 4 cases described above, the memory cell MC through which the memory-cell current Icell is flowing is the memory cell MC (0, 0) whereas the memory cell MC through which the memory-cell current Icell is not flowing is the memory cell MC (1, 0) as shown in FIGS. 15 and 16. In addition, the H condition is a condition in which the direction of the magnetization state of the storage layer 103 is opposite to the direction of the external magnetic field H whereas the L condition is a condition in which the direction of the magnetization state of the storage layer 103 is the same as the direction of the external magnetic field H. It is to be noted that, in order to distinguish the H and L conditions from the H and L states respectively, the H state is defined as a state in which the direction of the magnetization state of the storage layer 103 is opposite to the direction of the fixed-magnetization layer 102 whereas the L state is defined as a state in which the direction of the magnetization state of the storage layer 103 is the same as the direction of the fixed-magnetization layer 102 as described earlier.

Cases (1) to (4) described above correspond to the states shown in FIGS. 15A to 15D respectively.

Eqs. (3-1) to (3-4) given below are equations expressing the magnetization inversion probability Perr of the storage layer 103 for the above cases (1) to (4) respectively. In the equations, the effect of the memory-cell current Icell is taken into account as the sign of the term for notation I denoting the memory-cell current Icell whereas the effect of the external magnetic field H is taken into account as the sign of the term for notation H denoting the external-magnetic-field generation current I (or the field current mentioned before) flowing through the external-magnetic-field generation word line HWL0.

Equations 3

$$Perr = A\exp\{-(KuV/kT)(1-I/Ico)(1+H/Hco^2)\} \quad (3\text{-}1)$$

$$Perr = A\exp\{-(KuV/kT)(1+I/Ico)(1+H/Hco^2)\} \quad (3\text{-}2)$$

$$Perr = A\exp\{-(KuV/kT)(1+H/Hco)^2\} \quad (3\text{-}3)$$

$$Perr = A\exp\{-(KuV/kT)(1-H/Hco)^2\} \quad (3\text{-}4)$$

If the external magnetic field H is not applied, the value of 0 is inserted into the above equations as a substitute for notation H in order to compute the magnetization inversion probability Perr. For H=0, the following relations among the values of the magnetization inversion-probability Perr are obtained:

Perr of (3-1)>Perr of (3-3)=Perr of (3-4)>Perr of (3-2)

That is to say, the magnetization inversion probability Perr expressed by Eq. (3-1) for the state shown in FIG. 15A is highest among the probabilities expressed by all the equations. For higher intensities of the external magnetic field H, the value of magnetization inversion probability Perr increases or decreases in accordance with the equation.

Figure 19:
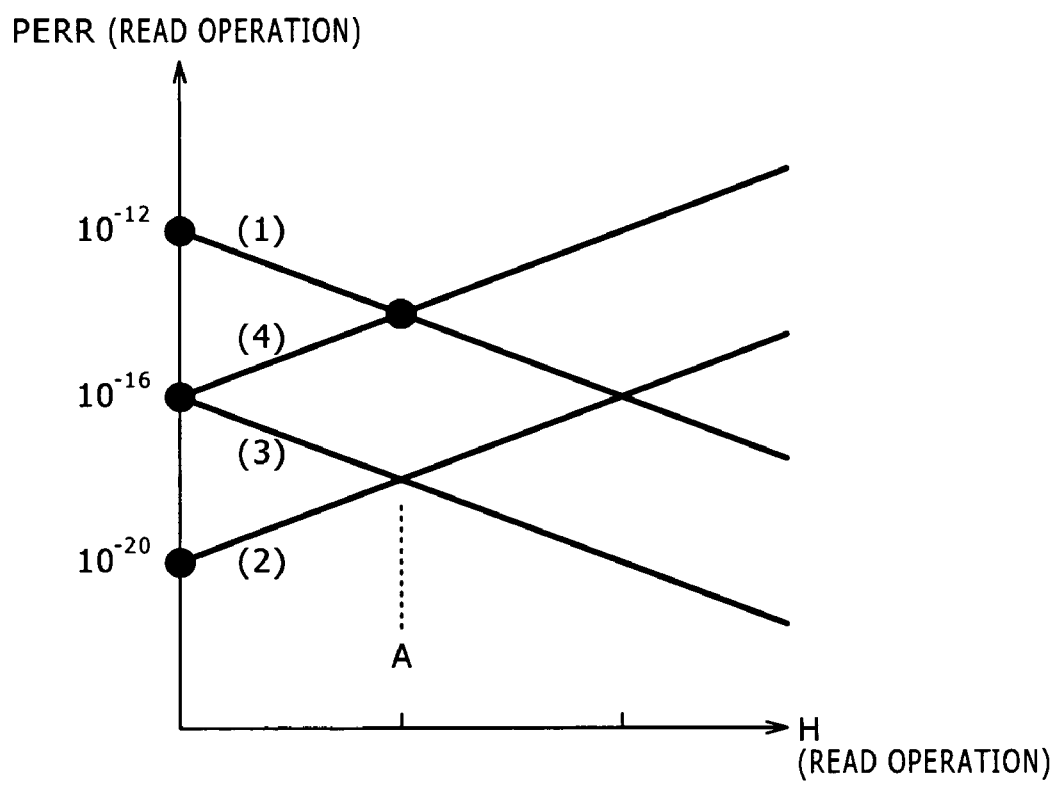
FIG. 19 is a diagram showing a plurality of graphs each representing a relation between an external magnetic field applied to a memory cell and a magnetization inversion probability caused by the external magnetic field in a read operation.

To put it concretely, for higher intensities of the external magnetic field H, the value of magnetization inversion probability Perr increases or decreases at a rate varying according to the equation as indicated by graphs (1) to (4) shown in FIG. 19 as graphs corresponding to the states shown in FIGS. 15A to 15D respectively.

In the case of the state shown in FIG. 15A as a state corresponding to Eq. (3-1), the memory-cell current Icell is flowing in the same direction as the write0 operation shown in FIG. 10A to unintentionally carry out a possible inadvertent write operation inverting the magnetization-state direction. On the other hand, the external magnetic field H is applied to suppress the inversion of the magnetization state-direction as described before. As the intensity of the external magnetic field H is increased little by little, the magnetization inversion probability Perr decreases gradually.

In the case of the state shown in FIG. 15B as a state corresponding to Eq. (3-2), the memory-cell current Icell is flowing in the same direction as the write0 operation shown in FIG. 10A to unintentionally carry out no possible inadvertent write operation, sustaining (or not inverting) the magnetization-state direction. At H=0, the magnetization inversion probability Perr is lowest. On the other hand, the external magnetic field H is applied to invert the magnetization state-direction as shown in FIG. 15B, increasing the magnetization inversion probability Perr. As the intensity of the external magnetic field H is increased little by little, the magnetization inversion probability Perr increases gradually.

In the case of the state shown in FIG. 15C as a state corresponding to Eq. (3-3) and the state shown in FIG. 15D as a state corresponding to Eq. (3-4), for H=0, as shown in FIG. 19, the values of the magnetization inversion probability Perr for these states is approximately in the middle between the values of the magnetization inversion probability Perr for the states shown in FIGS. 15A and 15B in conformity with following relations given before: Perr of (3-1)>Perr of (3-3) =Perr of (3-4)>Perr of (3-2)

However, in the case of the state shown in FIG. 15C, the direction of the external magnetic field H sustains the magnetization-state direction whereas, in the case of the state shown in FIG. 15D, the direction of the external magnetic field H makes an attempt to invert the magnetization-state direction. In the case of the state shown in FIG. 15C, as the intensity of the external magnetic field H is increased, the magnetization inversion probability Perr decreases as shown in FIG. 19. A sufficiently large intensity of the external magnetic field H for the case shown in FIG. 15C gives a magnetization inversion probability Perr even smaller than that of the state shown in FIG. 15B. That is to say, for intensities greater than A, the magnetization inversion probability Perr for the case shown in FIG. 15C is smaller than the magnetization inversion probability Perr for the case shown in FIG. 15B. In the case of the state shown in FIG. 15D, on the other hand, as the intensity of the external magnetic field H is increased, the magnetization inversion probability Perr increases. As shown in FIG. 19, an excessively large intensity of the external magnetic field H for the case shown in FIG. 15D gives a magnetization inversion probability Perr even greater than that of the state shown in FIG. 15A. That is to say, for intensities greater than A, the magnetization inversion probability Perr for the case shown in FIG. 15D is greater than the magnetization inversion probability Perr for the case shown in FIG. 15A.

The graphs shown in FIG. 19 suggest that, by applying an external magnetic field H having an intensity increased to a certain degree to a memory cell MC, as a whole, the value of the magnetization inversion probability Perr can be reduced from its peak value which is equal to the maximum value of the magnetization inversion probability Perr for H=0 in the case of the state shown in FIG. 15A. By applying an external magnetic field H having an intensity A corresponding to the intersection of graphs (1) and (4) or the intersection of graphs (2) and (3) to a memory cell MC for example, even though the values of the magnetization inversion probability Perr increase for graphs (4) and (2), the values of the magnetization inversion probability Perr decrease for graphs (3) and (1) and, in addition, all the values of the magnetization inversion probability Perr can be made smaller than the peak value.

That is to say, if it is quite within the bounds of possibility that there is a state in which the magnetization inversion probability Perr has an extremely high value, a margin against disturbances decreases in a read operation in the semiconductor memory device as a whole, unintentionally leading to an inadvertent write operation. If an external magnetic field H with an optimum intensity is applied to the semiconductor memory device in the read operation, however, it is possible to avoid the state in which the magnetization inversion probability Perr has an extremely high value. As a result, it is possible to increase the margin against disturbances in a read operation in the semiconductor memory device as a whole and prevent an inadvertent write operation from being carried out unintentionally during the read operation.

It is to be noted that, if the state shown in FIG. 15A occurs in the memory array 1 at the same frequency as the frequency at which the state shown in FIG. 15D does, it is desirable to execute control of setting the intensity of the generated external magnetic field H at point A at the intersection of graphs (1) and (4) representing the states shown in FIGS. 15A and 15D respectively. If the state shown in FIG. 15A occurs in the memory array 1 at a frequency different from the frequency at which the state shown in FIG. 15D does, however, it is nice to optimize the intensity of the external magnetic field H in accordance with the ratio of the frequency of the occurrence of the state shown in FIG. 15A to that of the state shown in FIG. 15D. The occurrence frequency is dependent on the configuration of the memory array 1 and the read method. That is to say, the occurrence frequency depends on whether the read method is a bit read method, a word read method or another read method. By the same token, if the state shown in FIG. 15D occurs in the memory array 1 at the same frequency as the frequency at which the state shown in FIG. 15C does, it is desirable to execute control of setting the intensity of the generated external magnetic field H at point A at the intersection of graphs (2) and (3) representing the states shown in FIGS. 15B and 15C respectively. If the state shown in FIG. 15B occurs in the memory array 1 at a frequency different from the frequency at which the state shown in FIG. 15C does, however, it is nice to optimize the intensity of the external magnetic field H in accordance with the ratio of the frequency of the occurrence of the state shown in FIG. 15B to that of the state shown in FIG. 15C.

What is described above has verified that, by actually applying an external magnetic field H to a tunnel magnetic resistance element TMR, the magnetization inversion probability Perr of the storage layer 103 included in the tunnel magnetic resistance element TMR can be reduced.

Figure 20:
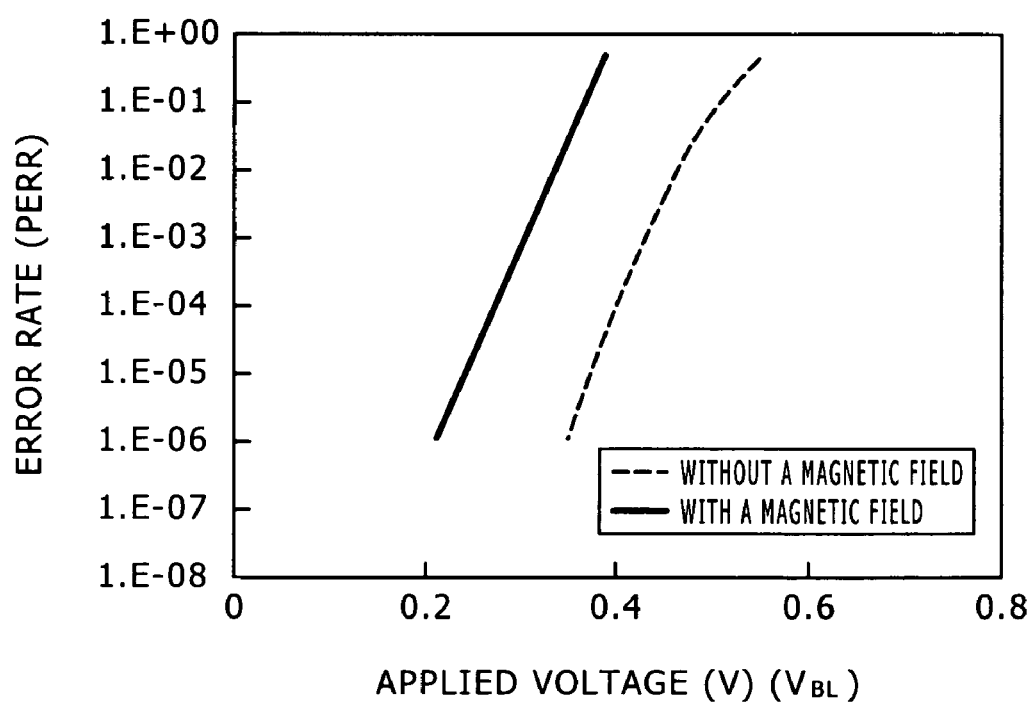
FIG. 20 is a diagram showing a plurality of graphs each representing a relation between the voltage applied to a memory cell in a read operation and the magnetization inversion probability obtained as a result of measurement.

FIG. 20 is a diagram showing graphs each representing a read error rate measured for a read operation carried out 1E6 times on a memory cell MC as the magnetization inversion probability Perr of the memory cell MC. The read error rate is measured in accordance with the following procedure:

(A): A write operation is carried out on the memory cell MC to set the memory cell MC in an H resistance state or to reset the memory cell MC.

(B): A read operation is carried out on the memory cell MC by applying an infinitesimal voltage such as 0.05 V not causing an inadvertent write operation unintentionally to the memory cell MC in order to verify the H resistance voltage.

(C): A constant voltage is applied to the memory cell MC for a fixed period of typically 100 ns. This constant voltage may be changed when repeating steps (A) to (D).

(D): A read operation is carried out on the memory cell MC by applying an infinitesimal voltage such as 0.05 V not causing an inadvertent write operation unintentionally to the memory cell MC in order to produce a result of determination as to whether or not the value of the bit data stored in the memory cell MC has been inverted.

(E): Steps A to D are repeated 1E6 times.

By carrying out the procedure described above, it is possible to simulate a process to measure dependence of the magnetization inversion probability Perr of the read operation on the voltage applied to the memory cell MC.

As shown in FIG. 20, the results of the measurement verify that, as the voltage applied to the bit line BL of the memory cell MC is increased, the rate at which the value of the bit data stored in the memory cell MC is inverted also increases as well.

Then, the same procedure was carried out to measure the magnetization inversion probability Perr by applying an external magnetic field H to the memory cell MC this time. As shown in FIG. 20, the results of the measurement performed by applying the external magnetic field H to the memory cell MC verify that the error rate is low in comparison with the results of the measurement carried out by applying no external magnetic field H to the memory cell MC. That is to say, if a read operation is carried out by applying an external magnetic field H to the memory cell MC, the results of observation suggest that the rate at which the value of the bit data stored in the memory cell MC is inverted is reduced.

It is to be noted that what is described above holds true of the read operation in the write0 mode in which the memory-cell current Icell flows in the downward direction from the side of the bit line BL to the side of the source line SL.

In the case of the read operation in the write1 mode in which the memory-cell current Icell reversely flows in the upward direction from the side of the source line SL to the side of the bit line BL, on the other hand, the existence/nonexistence of a memory-cell current Icell and the relations between the direction of the magnetization state of the storage layer 103 and the direction of the external magnetic field H can still be classified into the 4 cases similar to the 4 cases described above provided that the directions shown in FIG. 15 as the directions of the external magnetic field H are reversed. To put it more concretely, with the memory-cell current Icell flowing in the upward direction from the side of the fixed-magnetization layer 102 to the side of the storage layer 103, reversal of the direction of the external magnetic field H shown in FIG. 15A will give a case similar to case (2) described above. By the same token, with the memory-cell current Icell flowing in the upward direction, reversal of the direction of the external magnetic field H shown in FIG. 15B will give a case similar to case (1) described above.

In the same way, with the memory-cell current Icell flowing in the upward direction, reversal of the direction of the external magnetic field H shown in FIG. 15C will give a case similar to case (4) described above. Likewise, with the memory-cell current Icell flowing in the upward direction, reversal of the direction of the external magnetic field H shown in FIG. 15D will give a case similar to case (3) described above.

In order to flow the memory-cell current Icell in the upward direction from the side of the fixed-magnetization layer 102 to the side of the storage layer 103, the functions of the source-line read driver 7S and the bit-line sense amplifier 7B shown in FIG. 8 need to be swapped with each other. As described earlier, each of the source-line read driver 7S and the bit-line sense amplifier 7B is a peripheral circuit shown in FIG. 7 as a portion of the read driving circuit. In the configuration of the peripheral circuits shown in FIG. 8, the source-line read driver 7S is connected to the global source line GSL linked to the source line SL (M) wired to the selected memory cell MC (M, M) whereas the bit-line sense amplifier 7B is connected to the global bit line GBL linked to the bit line BL (M) wired to the selected memory cell MC (M, M). It is thus necessary to provide a configuration in which, typically, the column select switch circuit 8 is capable of swapping the functions of the source-line read driver 7S and the bit-line sense amplifier 7B shown in FIG. 8 with each other by re-linking the global bit line GBL connected to the bit-line sense amplifier 7B to the source line SL (M) wired to the selected memory cell MC (M, M) and re-linking the global source line GSL connected to the source-line read driver 7S to the bit line BL (M) wired to the selected memory cell MC (M, M). In this way, the roles played by the source line SL (M) and the bit line BL (M) in a read operation are swapped with each other. In this configuration, the direction of the current flowing through the external-magnetic-field generation line HWL (M) is also inverted when the functions of the source-line read driver 7S and the bit-line sense amplifier 7B are swapped with each other.

Second Embodiment

This embodiment adopts a method for generating an external magnetic field H without making use of an external-magnetic-field generation line HWL.

In accordance with a first method of this embodiment, a current is flowed through a read word line. This first method has an effect of elimination of the external-magnetic-field generation line HWL.

In accordance with a second method of this embodiment, while a current is flowing from a bit line BL to a source line SL in a read operation, the current is flowed from a portion over the bit line BL to a portion below the source line SL in order to generate an external magnetic field H. This second method also has an effect of elimination of the external-magnetic-field generation line HWL.

Since the direction of the external magnetic field H generated in accordance with the second method is rotated by an angle of 90 degrees from the direction of the external magnetic field H generated by a current flowing through the read word line in accordance with the first method, however, the orientation of the tunnel magnetic resistance element TMR must also be rotated by an angle of 90 degrees. To put it concretely, the direction of the long axis of the ellipse representing the tunnel magnetic resistance element TMR in FIGS. 3 and 4 must be taken as the direction of the short axis whereas the direction of the short axis of the ellipse representing the tunnel magnetic resistance element TMR in FIGS. 3 and 4 must be taken as the direction of the long axis. In addition, it is also possible to adopt another method whereby an external magnetic field H is generated by flowing a current to the source line SL. This method also has the same effect.

In accordance with a third method, an external magnetic field H generated by a current flowing from the bit line BL to the source line SL in a read operation is used. This third method also has the same effect of elimination of the external-magnetic-field generation line HWL as the first and second methods.

As described above, in accordance with the embodiments of the present invention, in an operation to read out bit data from a memory cell MC, an external magnetic field H is generated and applied to the memory cell MC. By properly setting the direction of the external magnetic field H and optimizing the intensity of the external magnetic field H, the inadvertent write operation can be prevented from occurring unintentionally in the memory array 1 as a whole or a margin against the occurrence of the inadvertent write operation can be increased. The elimination of the inadvertent write operation or the increase in such margin offer merits that the area of the memory cell MC can be reduced and the peripheral circuits can be simplified.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor memory device comprising:
a plurality of magnetic memory elements;
a control line group; and
a read driving circuit; wherein
each of said magnetic memory elements, which are arranged to form a matrix including a plurality of rows and a plurality of columns, is provided for one of memory cells and includes a storage layer for holding bit data as a direction of the magnetization state of said storage layer,
said control line group includes a plurality of first common lines each used for connecting one terminal of each of said memory cells to each other in the row or column direction and includes a plurality of second common lines each used for connecting the other terminal of each of said memory cells to each other in the row or column direction, and
said read driving circuit controls electric potentials appearing on said control line group in order to apply a read voltage to selected one of said magnetic memory elements as a voltage resulting in a difference in electric potential between a pair of said first and second common lines connected to said memory cell including said selected magnetic memory element from which bit data is to be read out and controls a field current flowing to said control line group in order to apply an external magnetic field to said selected magnetic memory element in a direction parallel to the direction of the magnetization state of said storage layer included in said selected magnetic memory element,
wherein said read driving circuit generates said external magnetic field in a direction opposite to a direction in which said direction of said magnetization state of said storage layer included in said selected magnetic memory element is to be changed inadvertently by a read current flowing to said selected magnetic memory element as a current resulting from application of said read voltage to said selected magnetic memory element.

2. The semiconductor memory device according to claim 1, wherein said read driving circuit is capable of inverting the polarity of said read voltage applied to said selected magnetic memory element as a voltage resulting in a difference in electric potential between a pair of said first and second common lines connected to said memory cell including said selected magnetic memory element so as to reverse the magnitude relation between said pair of said first and second common lines and, accompanying reversal of said magnitude relation, capable of inverting the direction of said external magnetic field to an opposite direction parallel to said direction of said magnetization state of said storage layer included in said selected magnetic memory element.

3. The semiconductor memory device according claim 1, said semiconductor memory device further including a third common line for flowing said field current generating said external magnetic field to be applied to a plurality of said magnetic memory elements arranged in a row or column direction at the same time.

4. The semiconductor memory device according claim 3, wherein
- each of said magnetic memory elements has a fixed-magnetization layer,
- said first common line on one side of said storage layer and said fixed-magnetization layer is connected to one of said storage layer and said fixed-magnetization layer,
- said third common line is provided on the other side of said storage layer and said fixed-magnetization layer in such a way that said third common line is capable of applying said external magnetic field to said storage layer and said fixed-magnetization layer, and
- said second common line is connected to the other one of said storage layer and said fixed-magnetization layer through an internal wire layer.

5. The semiconductor memory device according claim 1, wherein
- one of said first and second common lines is also used as a double-function line for flowing said field current for generating said external magnetic field, and
- said storage layer is designed to have an external appearance having a long-axis direction perpendicular to the longitudinal direction of said double-function line so that said direction of said magnetization state of said storage layer can be inverted from a direction parallel to said long-axis direction to an opposite direction parallel to said long-axis direction.

6. A semiconductor memory device comprising:
- a plurality of magnetic memory elements;
- a control line group; and
- a read driving circuit; wherein
- each of said magnetic memory elements, which are arranged to form a matrix including a plurality of rows and a plurality of columns is provided for one of memory cells and includes a storage layer for holding bit data as a direction of the magnetization state of said storage layer,
- said control line group includes a plurality of first common lines each used for connecting one terminal of each of said memory cells to each other in the row or column direction and includes a plurality of second common lines each used for connecting the other terminal of each of said memory cells to each other in the row or column direction, and
- said read driving circuit controls electric potentials appearing on said control line group in order to apply a read voltage to selected one of said magnetic memory elements as a voltage resulting in a difference in electric potential between a pair of said first and second common lines connected to said memory cell including said selected magnetic memory element from which bit data is to be read out and controls a field current flowing to said control line group in order to apply an external magnetic field to said selected magnetic memory element in a direction parallel to the direction of the magnetization state of said storage layer included in said selected magnetic memory element, wherein
- said external magnetic field is generated by flowing said field current having a magnitude determined on the basis of a tradeoff between,
- a probability at which said direction of said magnetization state of said storage layer included in said selected magnetic memory element is inadvertently inverted by a read current generated by said read voltage applied to said selected magnetic memory element as a voltage resulting in a difference in electric potential between said pair of said first and second common lines connected to said memory cell including said selected magnetic memory element, and
- a probability at which the direction of a particular magnetization state of said storage layer in a particular magnetic memory element is inadvertently inverted by said external magnetic field where said particular magnetic memory element is defined as a magnetic memory element included in said magnetic memory elements as a magnetic memory element to which said read current is not flowed but said external magnetic field is applied to result in said particular magnetization state having a direction opposite to said direction of said magnetization state of said storage layer included in said selected magnetic memory element.

* * * * *